United States Patent
Harada et al.

(10) Patent No.: US 12,408,344 B2
(45) Date of Patent: Sep. 2, 2025

(54) SEMICONDUCTOR MEMORY DEVICE

(71) Applicant: Kioxia Corporation, Tokyo (JP)

(72) Inventors: Hisashi Harada, Yokkaichi (JP); Keisuke Suda, Yokkaichi (JP)

(73) Assignee: Kioxia Corporation, Tokyo (JP)

( * ) Notice: Subject to any disclaimer, the term of this patent is extended or adjusted under 35 U.S.C. 154(b) by 553 days.

(21) Appl. No.: 17/931,621

(22) Filed: Sep. 13, 2022

(65) Prior Publication Data

US 2023/0262983 A1 Aug. 17, 2023

(30) Foreign Application Priority Data

Feb. 16, 2022 (JP) .................. 2022-022291

(51) Int. Cl.
*H10B 43/35* (2023.01)
*G11C 5/06* (2006.01)
*H10B 43/20* (2023.01)

(52) U.S. Cl.
CPC ............. *H10B 43/35* (2023.02); *G11C 5/063* (2013.01); *H10B 43/20* (2023.02)

(58) Field of Classification Search
CPC ........ H10B 43/35; H10B 43/20; H10B 43/50; H10B 43/40; H10B 43/10; H10B 43/27; G11C 5/063; G11C 16/0483
See application file for complete search history.

(56) References Cited

U.S. PATENT DOCUMENTS

| | | | |
|---|---|---|---|
| 10,020,319 B2 * | 7/2018 | Baba .................. | H10D 30/0413 |
| 10,090,315 B2 | 10/2018 | Fukuzumi et al. | |
| 10,217,757 B2 * | 2/2019 | Shimojo ............... | H10B 43/40 |
| 10,361,218 B2 * | 7/2019 | Arai ..................... | H01L 21/764 |
| 10,510,770 B2 | 12/2019 | Harada et al. | |
| 2016/0079164 A1 * | 3/2016 | Fukuzumi ............. | H01L 24/80 |
| | | | 438/107 |
| 2017/0162594 A1 * | 6/2017 | Ahn ..................... | H10B 41/27 |
| 2020/0161333 A1 * | 5/2020 | Oike .................... | H10B 43/35 |
| 2020/0227435 A1 * | 7/2020 | Hwang ................ | H10B 43/40 |
| 2020/0303408 A1 * | 9/2020 | Yoshimizu ........... | H10B 43/40 |
| 2021/0082939 A1 * | 3/2021 | Matsuda .............. | H10B 41/35 |
| 2021/0082950 A1 * | 3/2021 | Yoshimizu ........... | H01L 23/528 |

FOREIGN PATENT DOCUMENTS

| | | |
|---|---|---|
| JP | 2016-62901 A | 4/2016 |
| JP | 2019-161042 A | 9/2019 |

* cited by examiner

*Primary Examiner* — Steven B Gauthier
*Assistant Examiner* — Khatib A Rahman
(74) *Attorney, Agent, or Firm* — Oblon, McClelland, Maier & Neustadt, L.L.P.

(57) ABSTRACT

According to one embodiment, a semiconductor memory device includes: a semiconductor layer arranged above a substrate in a first direction; a first interconnect layer between the substrate and the semiconductor layer; a second interconnect layer arranged adjacent to the first interconnect layer in a second direction; a plurality of memory pillars; and a first member between the first interconnect layer and the second interconnect layer. The semiconductor layer has, on a side of a second surface facing a first surface in contact with the first member, a first projecting portion projecting in the first direction and overlapping a part of an area in the first direction, the area being provided with the first interconnect layer and the first member.

20 Claims, 26 Drawing Sheets

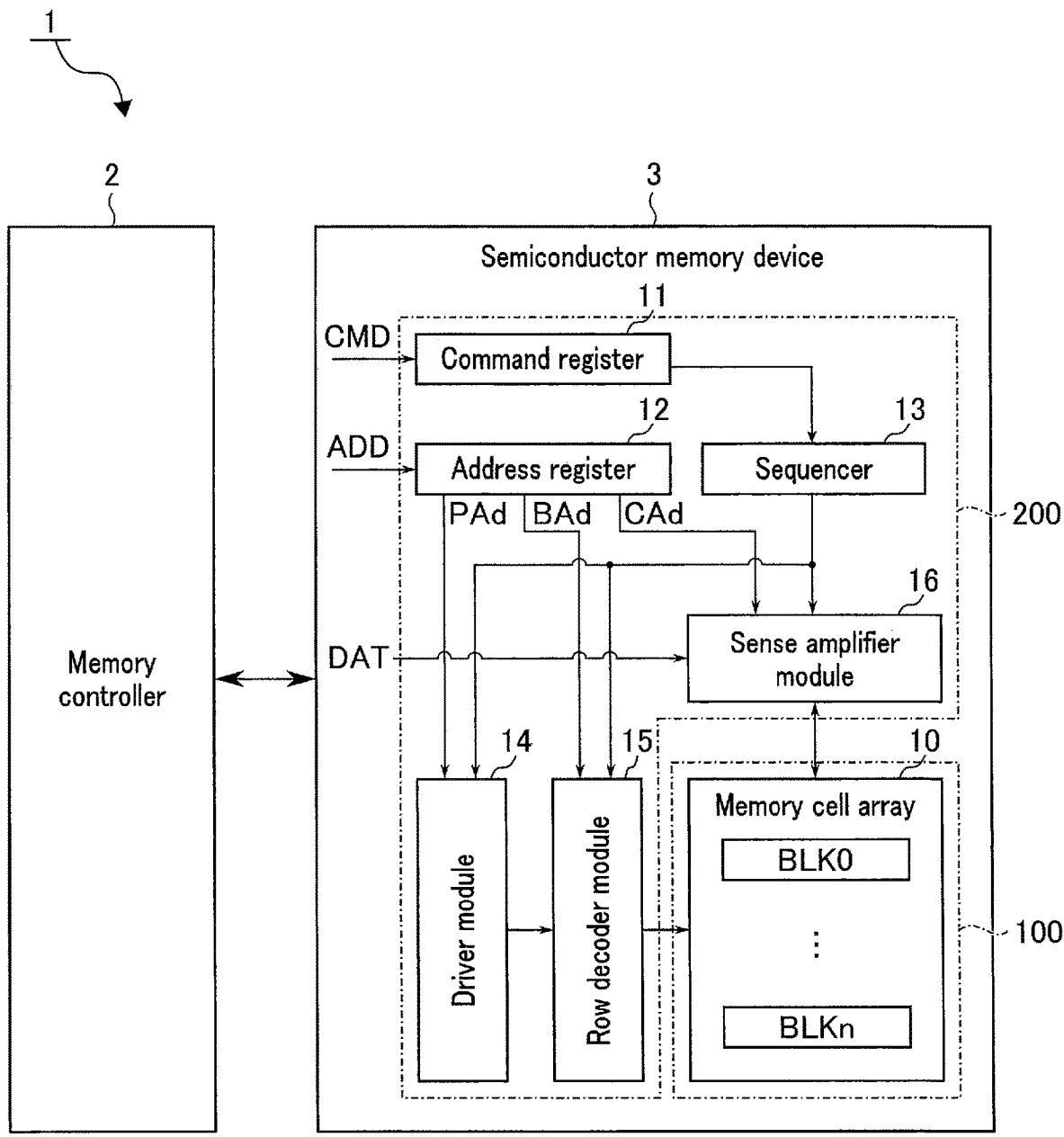
F I G. 1

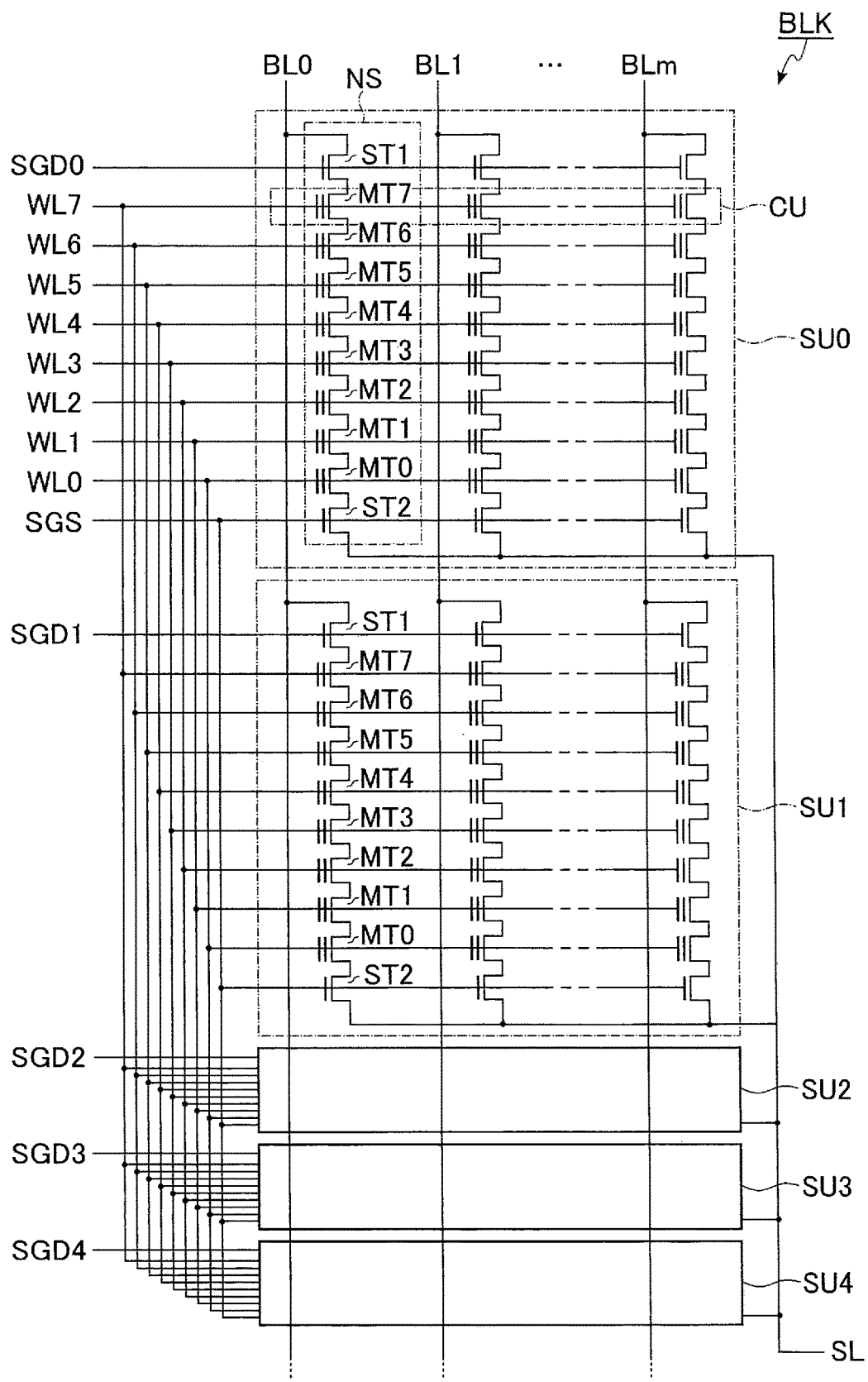
F I G. 2

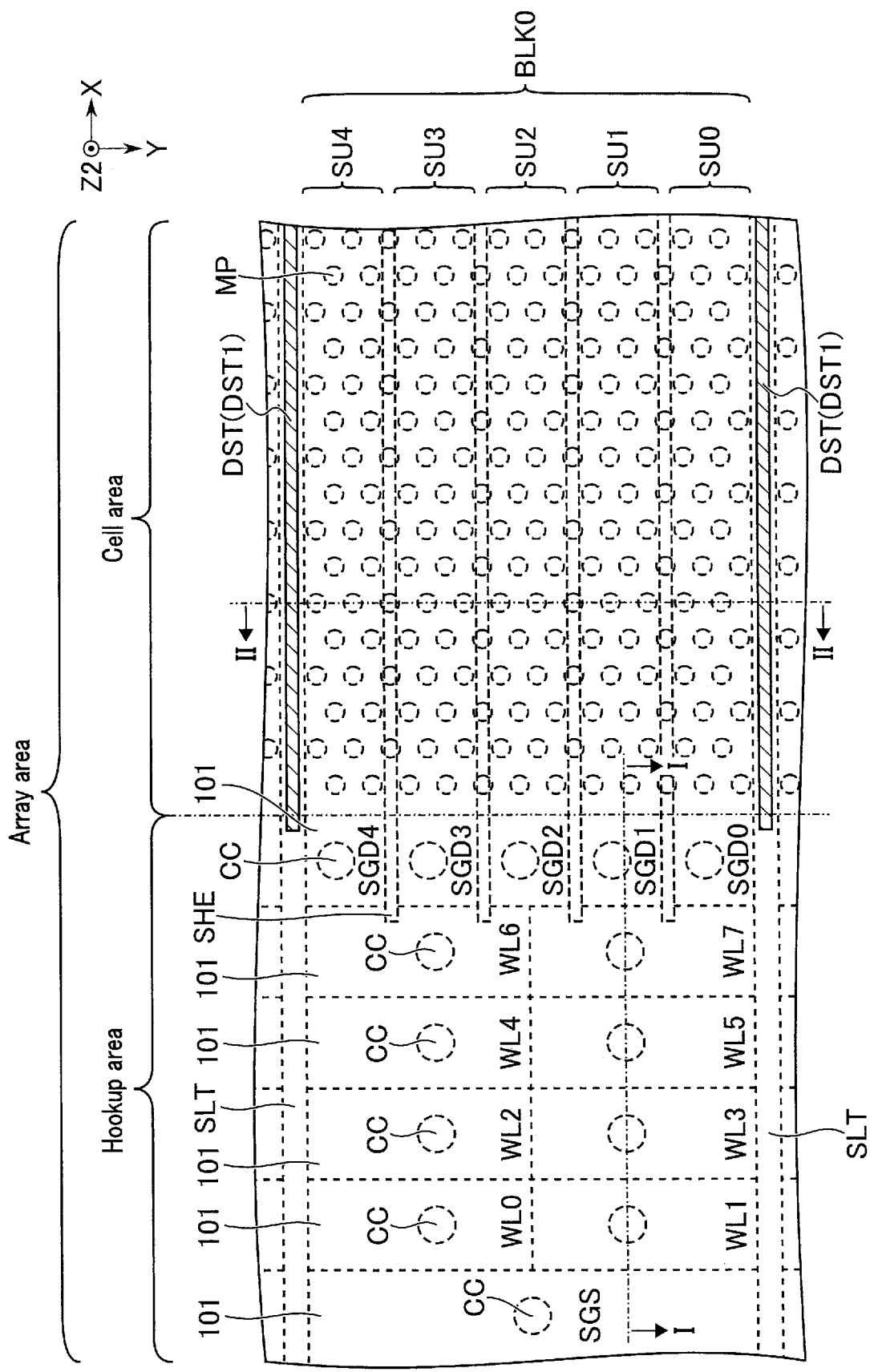
F I G. 5

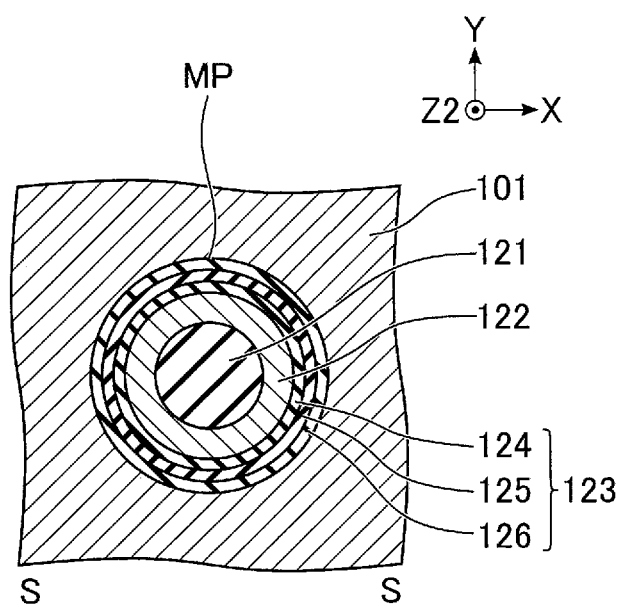
F I G. 7

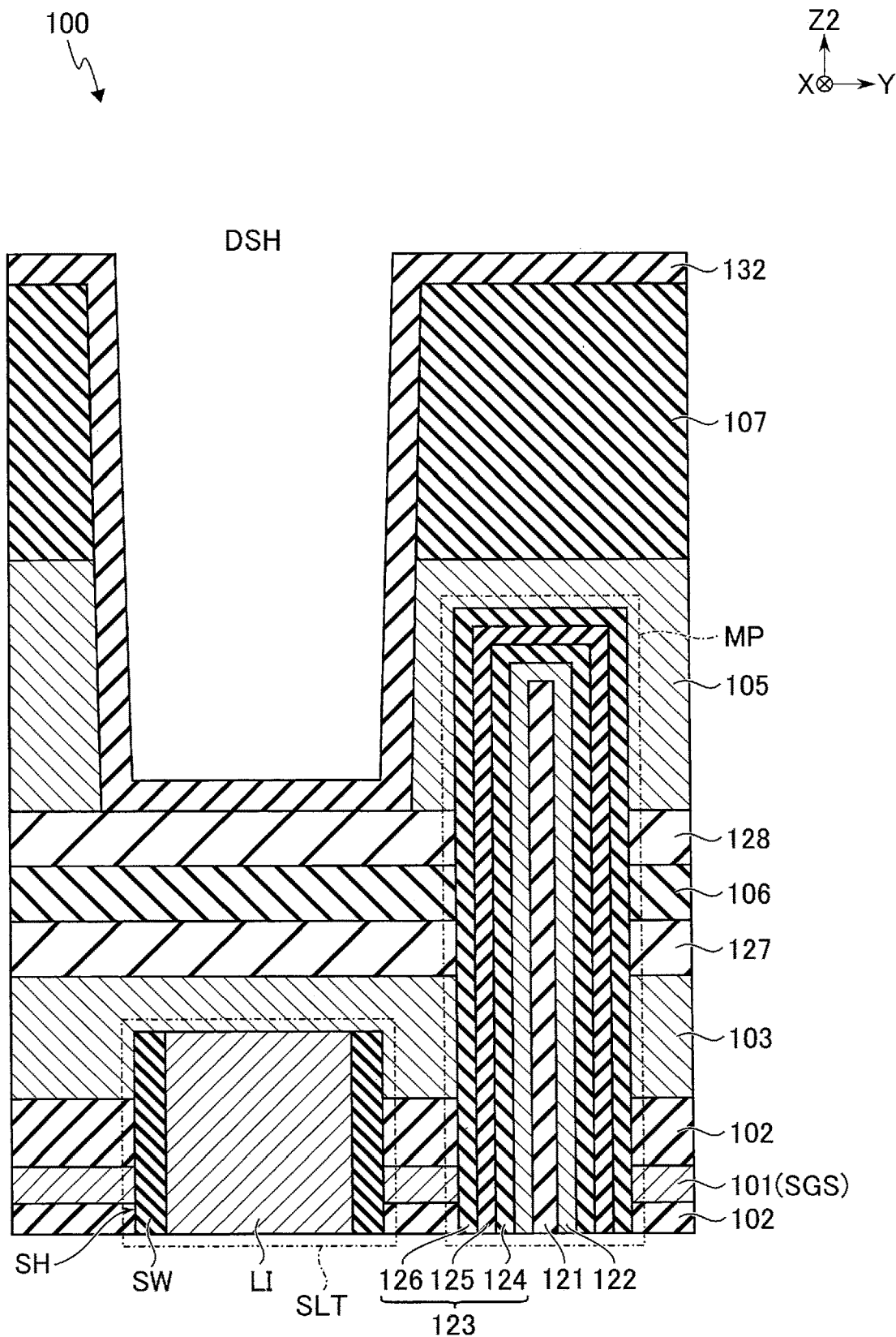
F I G. 12

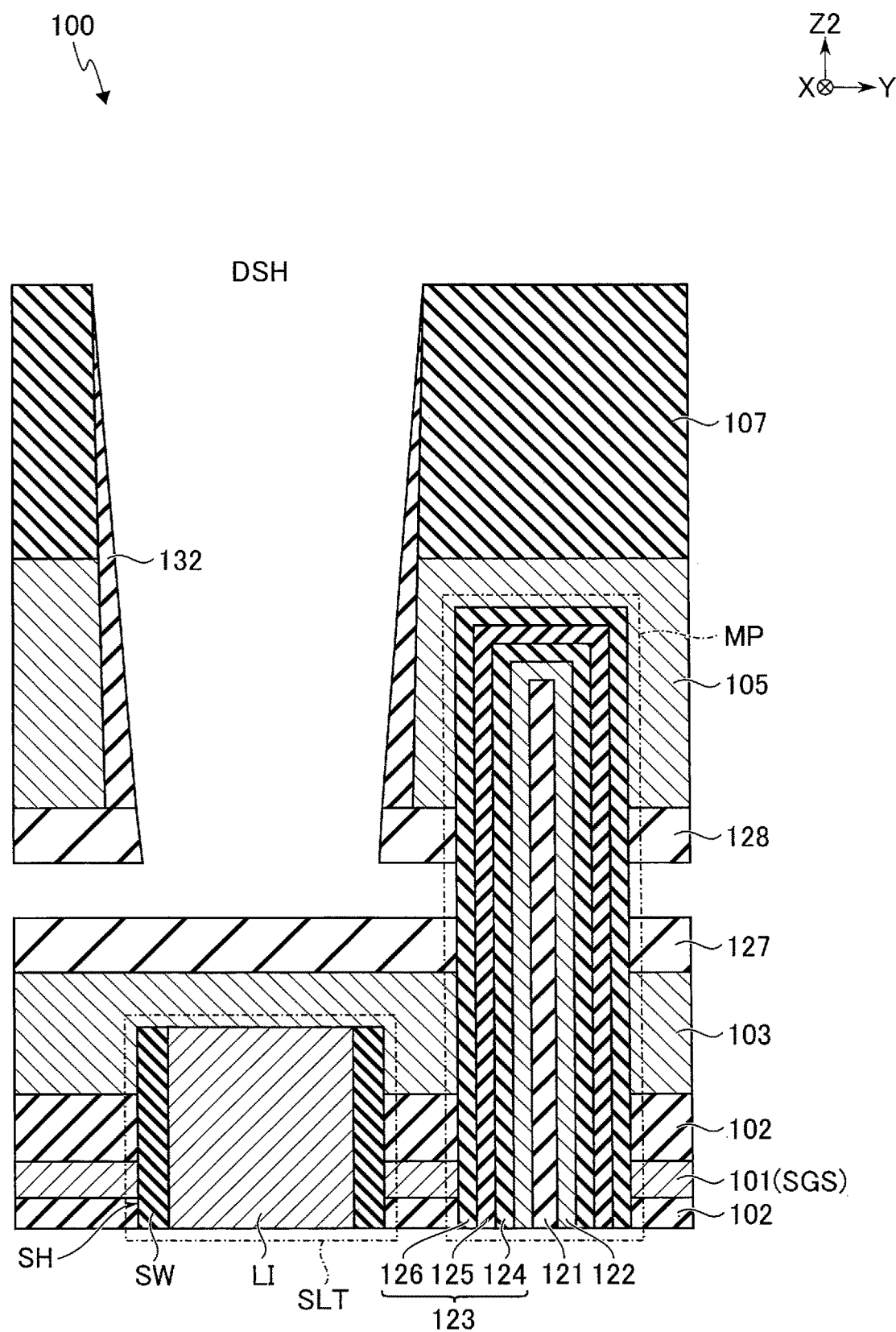
F I G. 14

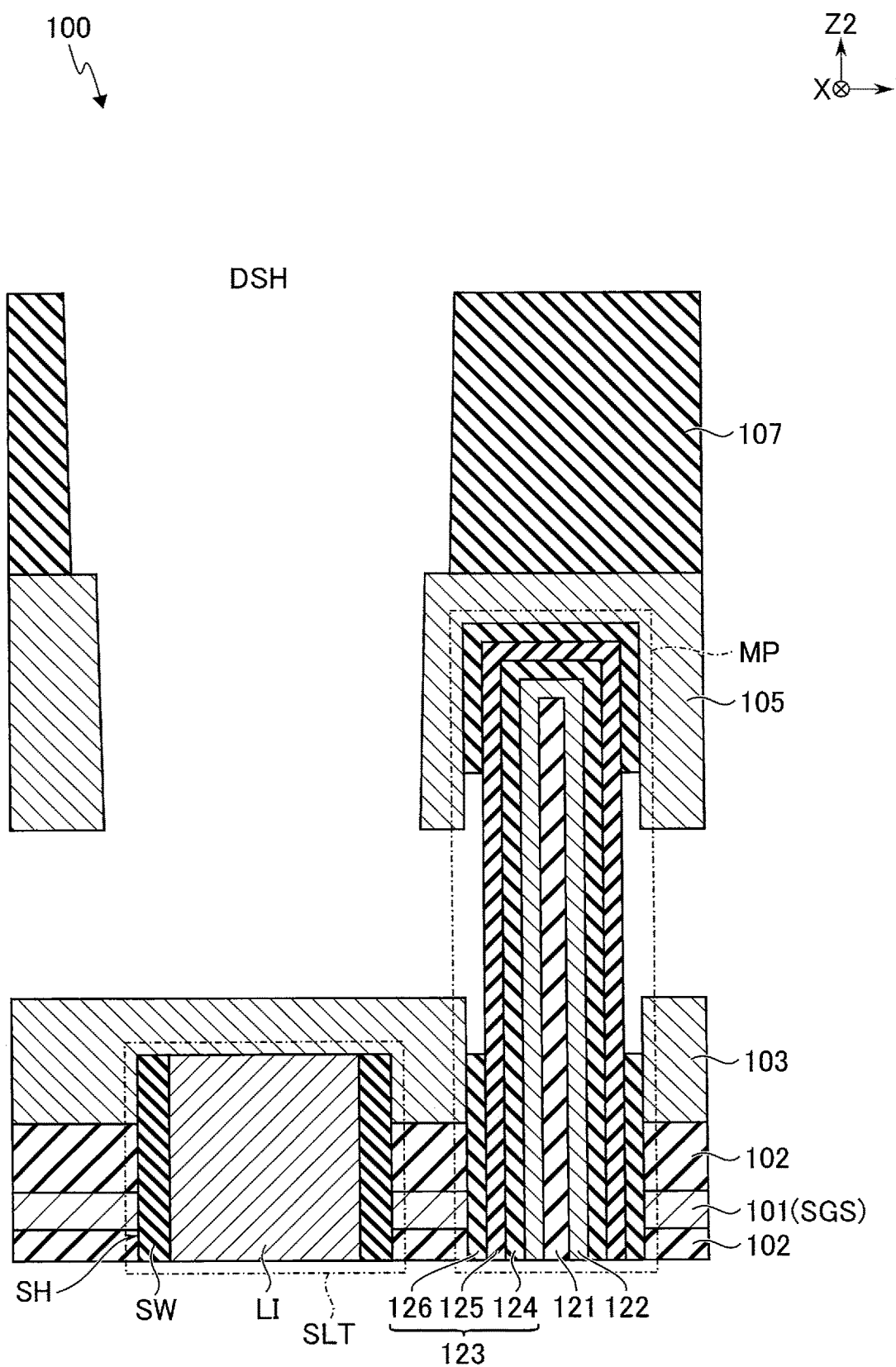
F I G. 15

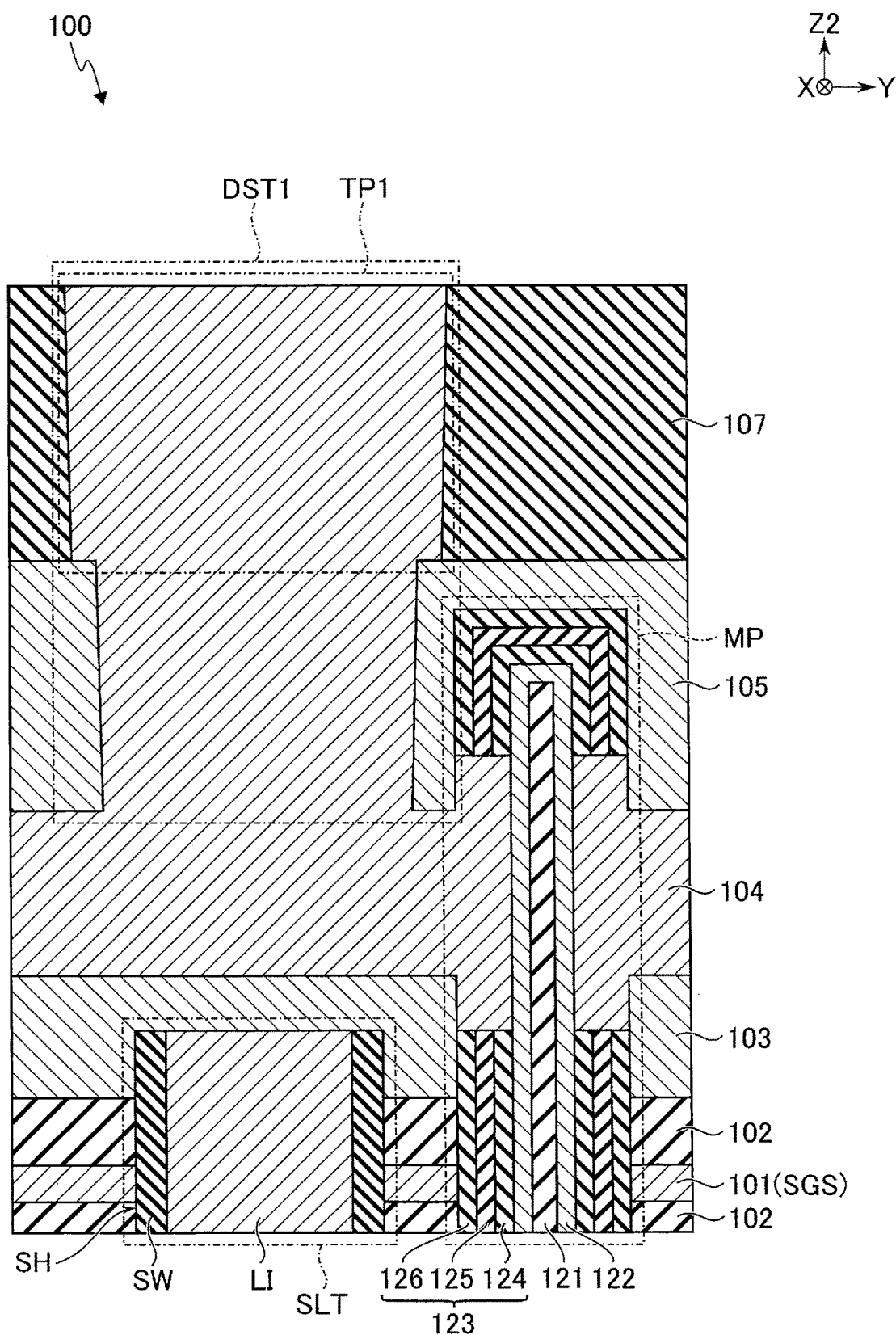
F I G. 17

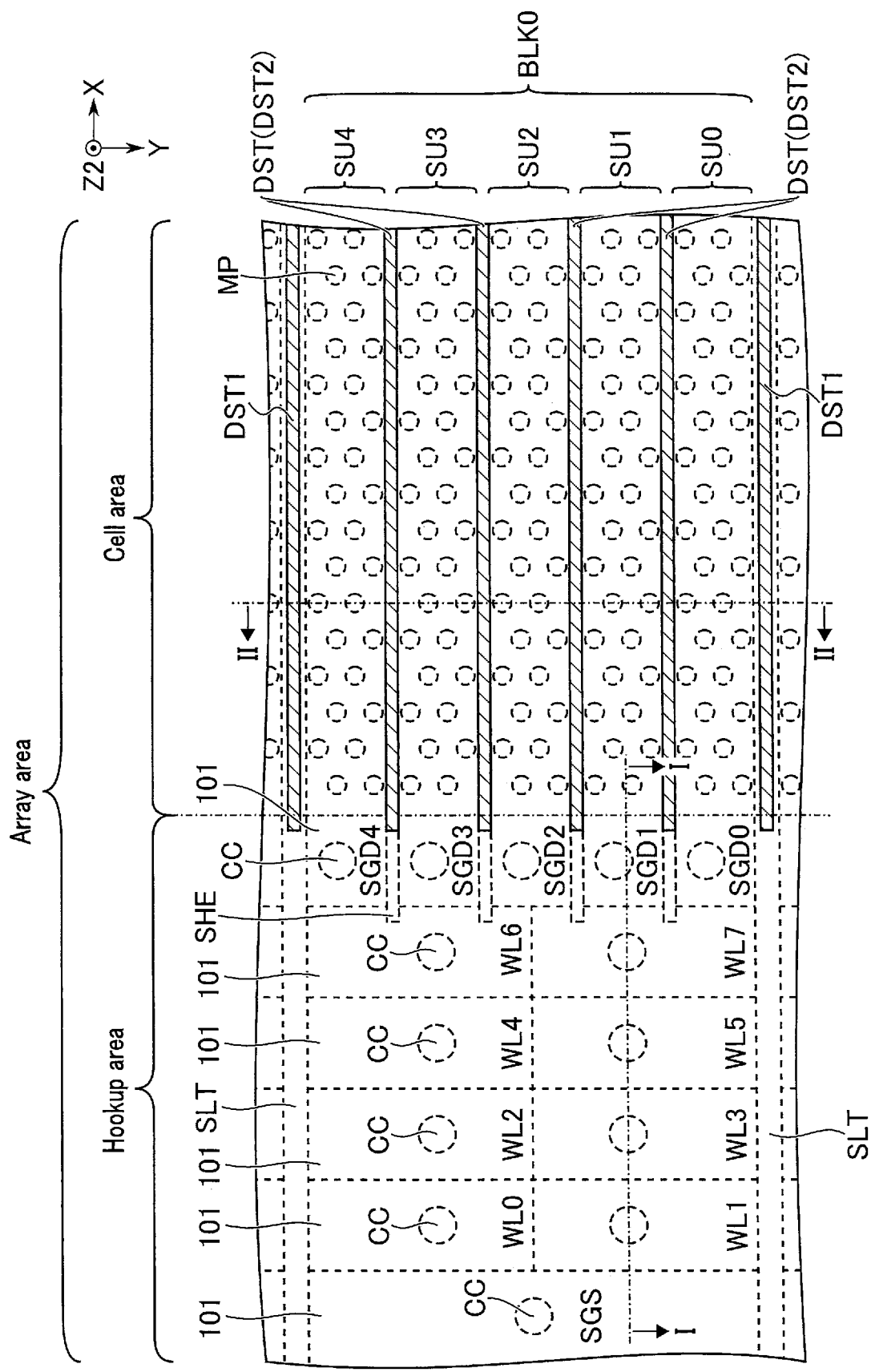
F I G. 21

SEMICONDUCTOR MEMORY DEVICE

CROSS-REFERENCE TO RELATED APPLICATIONS

This application is based upon and claims the benefit of priority from Japanese Patent Application No. 2022-022291, filed Feb. 16, 2022, the entire contents of which are incorporated herein by reference.

FIELD

Embodiments described herein relate generally to a semiconductor memory device.

BACKGROUND

A NAND flash memory is known as a semiconductor memory device capable of storing data in a nonvolatile manner. A semiconductor memory device such as a NAND flash memory may adopt a three-dimensional memory structure for higher integration and higher capacity.

BRIEF DESCRIPTION OF THE DRAWINGS

FIG. 1 is a block diagram showing a configuration of a memory system including a semiconductor memory device according to a first embodiment.

FIG. 2 is a circuit diagram showing an example of a circuit configuration of a memory cell array included in the semiconductor memory device according to the first embodiment.

FIG. 5 is a plan view showing an example of a planar structure when viewed from an upper surface in a Z2 direction in the array area of the semiconductor memory device according to the first embodiment.

FIG. 7 is a cross-sectional view taken along line S-S of FIG. 6 and shows an example of a cross-sectional structure of a memory pillar in the array area of the semiconductor memory device according to the first embodiment.

FIG. 12 is a cross-sectional view showing an example of a cross-sectional structure during a process of manufacturing the semiconductor memory device according to the first embodiment.

FIG. 14 is a cross-sectional view showing an example of a cross-sectional structure during a process of manufacturing the semiconductor memory device according to the first embodiment.

FIG. 15 is a cross-sectional view showing an example of a cross-sectional structure during a process of manufacturing the semiconductor memory device according to the first embodiment.

FIG. 17 is a cross-sectional view showing an example of a cross-sectional structure during a process of manufacturing the semiconductor memory device according to the first embodiment.

FIG. 21 is a plan view showing an example of a planar structure when viewed from an upper surface in the Z2 direction in an array area of a semiconductor memory device according to a second embodiment.

DETAILED DESCRIPTION

Figure 3:
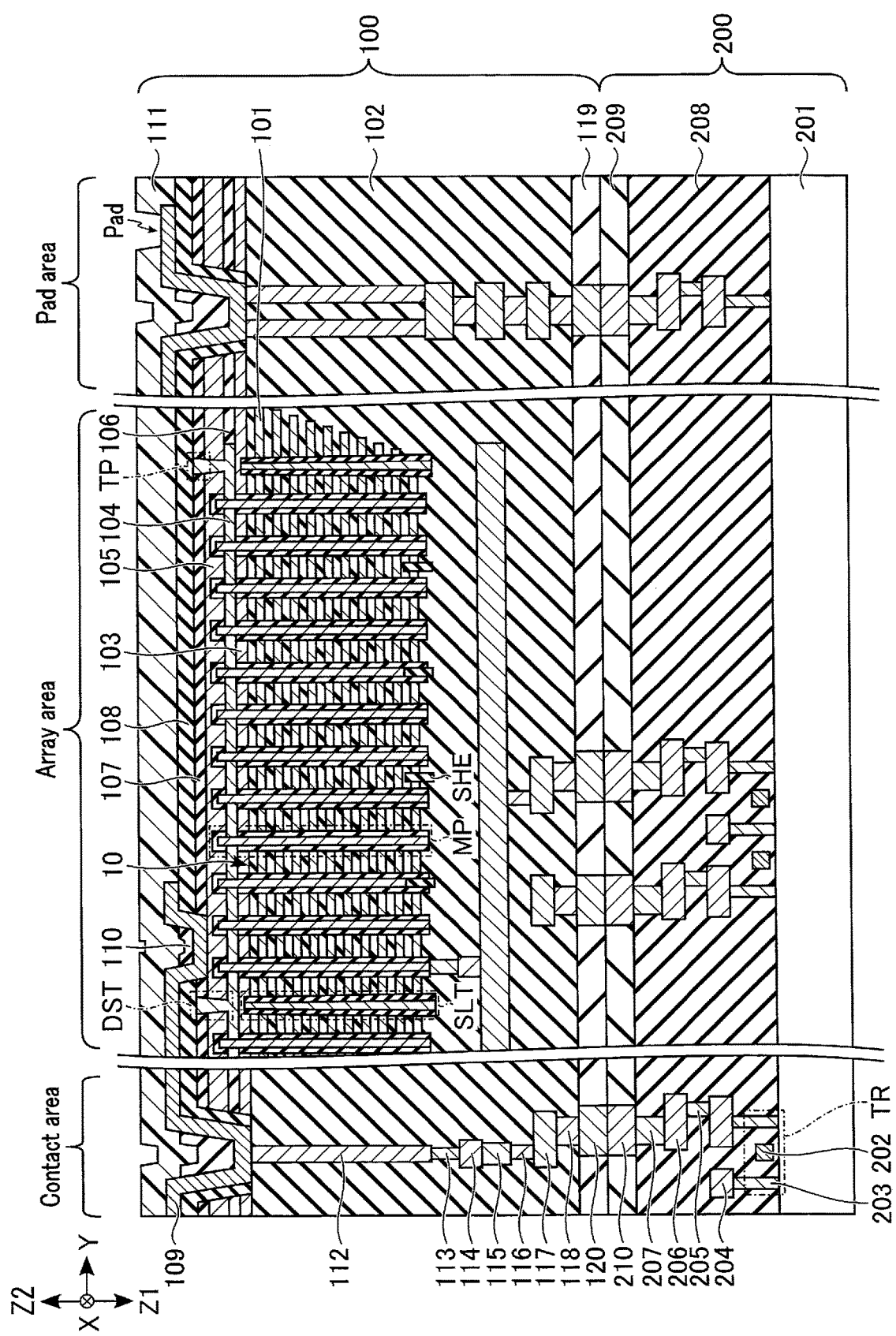
FIG. 3 is a cross-sectional view showing an example of a cross-sectional structure of the semiconductor memory device according to the first embodiment.

In general, according to one embodiment, a semiconductor memory device includes: a semiconductor layer arranged above a substrate in a first direction; a first interconnect layer arranged between the substrate and the semiconductor layer;

a second interconnect layer arranged between the substrate and the semiconductor layer and arranged adjacent to the first interconnect layer in a second direction intersecting the first direction; a plurality of memory pillars extending in the first direction and penetrating through the first interconnect layer, an end portion in the first direction of each of the memory pillars being in contact with the semiconductor layer; and a first member provided between the first interconnect layer and the second interconnect layer in the second direction, an end portion in the first direction of the first member being in contact with the semiconductor layer. The semiconductor layer has, on a side of a second surface facing a first surface in contact with the first member, a first projecting portion projecting in the first direction and overlapping a part of an area in the first direction, the area being provided with the first interconnect layer and the first member.

Hereinafter, embodiments will be described with reference to the accompanying drawings. The dimensions and ratios, etc. in the drawings are not always the same as the actual ones. In the following description, constituent elements having substantially the same function and configuration will be assigned the same reference symbol. In the case where elements having similar configurations are distinguished from each other in particular, identical reference symbols may be assigned different letters or numbers.

1. First Embodiment

1.1 Configuration

1.1.1 Configuration of Memory System

A configuration of a memory system including a semiconductor memory device according to a first embodiment will be described with reference to FIG. 1 FIG. 1 is a block diagram showing a configuration of the memory system. The memory system is a memory device configured to be connected to an external host device (not shown). The memory system is, for example, a memory card such as an SD™ card, a universal flash storage (UFS), or a solid state drive (SSD). The memory system 1 includes a memory controller 2 and a semiconductor memory device 3.

The memory controller 2 is constituted by an integrated circuit such as a system-on-a-chip (SoC). The memory controller 2 controls the semiconductor memory device 3, based on a request received from the host device. Specifically, for example, the memory controller 2 writes data which is requested to be written by the host device to the semiconductor memory device 3. Furthermore, the memory controller 2 reads data which is requested to be read by the host device from the semiconductor memory device 3 and transmits the read data to the host device.

The semiconductor memory device 3 is a memory configured to store data in a nonvolatile manner. The semiconductor memory device 3 is, for example, a NAND flash memory.

1.1.2 Configuration of Semiconductor Memory Device

A configuration of the semiconductor memory device according to the first embodiment will be described by continuously referring to FIG. 1. The semiconductor memory device 3 includes an array chip 100 and a circuit chip 200.

The array chip 100 includes, for example, a memory cell array 10.

The memory cell array 10 includes a plurality of blocks BLK0 to BLKn (where n is an integer equal to or greater than 1). The block BLK is a set of a plurality of memory cell transistors that can store data in a nonvolatile manner, and is used as, for example, a data erase unit. In the memory cell array 10, a plurality of bit lines and a plurality of word lines are provided. Each memory cell transistor is associated with, for example, a single bit line and a single word line. A detailed configuration of the memory cell array 10 will be described later.

The circuit chip 200 includes, for example, a command register 11, an address register 12, a sequencer 13, a driver module 14, a row decoder module 15, and a sense amplifier module 16.

The command register 11 stores a command CMD received by the semiconductor memory device 3 from the memory controller 2. The command CMD includes, for example, an order to cause the sequencer 13 to execute a read operation, a write operation, an erase operation, and the like.

The address register 12 stores address information ADD received by the semiconductor memory device 3 from the memory controller 2. The address information ADD includes, for example, a block address BAd, a page address PAd, and a column address CAd. For example, the block address BAd, the page address PAd, and the column address CAd are used to select a block BLK, a word line, and a bit line, respectively.

The sequencer 13 controls the overall operation of the semiconductor memory device 3. For example, the sequencer 13 controls the driver module 14, the row decoder module 15, and the sense amplifier module 16, etc., based on the command CMD stored in the command register 11, thereby executing the read operation, the write operation, the erase operation, and the like.

The driver module 14 generates voltages used in the read operation, the write operation, the erase operation, and the like. Then, the driver module 14 applies, for example, the generated voltage to a signal line corresponding to a selected word line based on the page address PAd stored in the address register 12.

Based on the block address BAd stored in the address register 12, the row decoder module 15 selects one block BLK in the corresponding memory cell array 10. Then, the row decoder module 15 transfers, for example, the voltage applied to the signal line corresponding to the selected word line to the selected word line in the selected block BLK.

The sense amplifier module 16 selects a bit line based on the column address CAd stored in the address register 12. In a write operation, the sense amplifier module 16 applies a voltage to a selected bit line in accordance with write data DAT received from the memory controller 2. In a read operation, the sense amplifier module 16 determines data stored in a memory cell transistor based on a voltage of the selected bit line, and transfers the determination result as read data DAT to the memory controller 2.

1.1.3 Circuit Configuration of Memory Cell Array

A circuit configuration of the memory cell array 10 will be described with reference to FIG. 2. FIG. 2 is a circuit diagram showing an example of a circuit configuration of the memory cell array 10. FIG. 2 shows one of the plurality of blocks BLK included in the memory cell array 10. As shown in FIG. 2, the block BLK includes, for example, five string units, SU0 to SU4. The string unit SU is a set of NAND strings NS to be described later. For example, in the write operation or the read operation, NAND strings NS in the string unit SU are selected in a batch.

Each string unit SU includes a plurality of NAND strings NS that are respectively associated with bit lines BL0 to BLm (m is an integer equal to or greater than 1). Each NAND string NS includes, for example, memory cell transistors MT0 to MT7 and select transistors ST1 and ST2. Each memory cell transistor MT includes a control gate and a charge storage layer, and stores data in a nonvolatile manner. Each of the select transistors ST1 and ST2 is used for selection of a string unit SU in various operations.

In each NAND string NS, memory cell transistors MT0 to MT7 are coupled in series. A drain of the select transistor ST1 is coupled to the associated bit line BL. A source of the select transistor ST1 is coupled to one end of the memory cell transistors MT0 to MT7 coupled in series. A drain of the select transistor ST2 is coupled to the other end of the memory cell transistors MT0 to MT7 coupled in series. A source of the select transistor ST2 is coupled to a source line SL.

The control gates of the memory cell transistors MT0 to MT7 in the same block BLK are respectively coupled to the word lines WL0 to WL7. Gates of the select transistors ST1 in the string units SU0 to SU4 are respectively coupled to select gate lines SGD0 to SGD4. Gates of the select transistors ST2 in the string units SU0 to SU4 are coupled to a select gate line SGS.

The bit lines BL0 to BLm are respectively assigned different column addresses CAd. Each bit line BL is shared by the NAND strings NS assigned the same column address CAd among a plurality of blocks BLK. Each of word lines WL0 to WL7 is provided for each block BLK. The source line SL is shared by, for example, the plurality of blocks BLK.

A set of memory cell transistors MT commonly coupled to a word line WL in one string unit SU may be referred to as a cell unit CU, for example. For example, the storage capacity of the cell unit CU including the memory cell transistors MT respectively configured to store 1-bit data is defined as "1-page data". The cell unit CU may have a storage capacity of 2-page data or more based on the number of bits of data stored in the memory cell transistors MT.

The circuit configuration of the memory cell array 10 included in the semiconductor memory device 3 according to the first embodiment is not limited to the configuration described in the above. For example, the number of string units SU included in each block BLK may be any number. The numbers of memory cell transistors MT, select transistors ST1, and select transistors ST2 included in each NAND string NS may be any number.

1.1.4 Cross-sectional Structure of Semiconductor Memory Device

An example of a cross-sectional structure of the semiconductor memory device 3 will be described with reference to FIG. 3. FIG. 3 is a cross-sectional view showing an example of a cross-sectional structure of the semiconductor memory device 3. In the following description, an X direction is substantially parallel to a semiconductor substrate 201 and corresponds to, for example, a direction in which the word lines WL extend. A Y direction is substantially parallel to the semiconductor substrate 201, intersects the X direction, and corresponds to, for example, a direction in which the bit lines BL extend. A Z1 direction is substantially perpendicular to the semiconductor substrate 201 and corresponds to a direction from the array chip 100 to the circuit chip 200. A Z2 direction is substantially perpendicular to the semiconductor substrate 201 and corresponds to a direction from the circuit chip 200 to the array chip 100. The Z1 direction and the Z2 direction will each be referred to as a Z direction when they are not distinguished from each other.

The semiconductor memory device 3 has a structure in which the array chip 100 and the circuit chip 200 are bonded together.

The array chip 100 includes the memory cell array 10 and various interconnects for coupling the memory cell array 10 to the circuit chip 200.

More specifically, the array chip 100 includes a plurality of interconnect layers 101, an insulating layer 102, semiconductor layers 103 to 105, insulating layers 106 to 108, an interconnect layer 109, an insulating layer 110, a passivation layer 111, a plurality of contact plugs 112 to 114, an interconnect layer 115, a plurality of contact plugs 116, an interconnect layer 117, a plurality of contact plugs 118, an insulating layer 119, a plurality of electrode pad 120, a plurality of memory pillars MP, a plurality of members SLT, and a plurality of members SHE.

The array chip 100 includes an array area, a contact area, and a pad area. The array area is an area provided with a plurality of memory pillars MP. The contact area is an area for use in coupling between the source line SL and the circuit chip 200. The pad area is an area for use in coupling between an outside of the semiconductor memory device 3 and the circuit chip 200.

In the array area, a plurality of (10) interconnect layers 101 are stacked with a space therebetween in the Z direction. The interconnect layers 101 function as the word line WL and the select gate lines SGD and SGS. The end portions in the X direction of the interconnect layers 101 are drawn out in a stepwise manner. The insulating layer 102 is provided between the interconnect layers 101.

The semiconductor layers 103, 104, and 105 are stacked above the uppermost interconnect layer 101 in the Z2 direction. The semiconductor layers 103, 104, and 105 each function as the source line SL. The insulating layer 102 is provided between the uppermost interconnect layer 101 and the semiconductor layer 103. The insulating layers 107 and 108, the interconnect layer 109, the insulating layer 110, and the passivation layer 111 are provided on the semiconductor layer 105 in the Z2 direction. The semiconductor layer 104 has a portion (hereinafter, also referred to as a "member DST") penetrating through the semiconductor layer 105 and the insulating layer 107 in the Z2 direction. The end in the Z2 direction of the member DST is in contact with the insulating layer 108. The member DST has a projecting portion TP that projects in the Z2 direction (toward the insulating layer 107) from a surface facing in the Z2 direction of the semiconductor layer 105. The insulating layer 106 is provided in a part of the area between the semiconductor layer 103 and the semiconductor layer 105. The end in the Y direction of the semiconductor layer 104 is in contact with the insulating layer 106. A part of the interconnect layer 109 is in contact with the semiconductor layer 105 in the Z1 direction. The insulating layer 110 is provided on a part of the interconnect layer 109 in the Z2 direction. The insulating layer 110 is formed in such a manner as to fill a concave portion of the interconnect layer 109. The passivation layer 111 covers the insulating layer 108, the interconnect layer 109, and the insulating layer 110 in the Z2 direction.

The plurality of memory pillars MP extend in the Z direction and penetrate through the plurality of interconnect layers 101 and the semiconductor layers 103 and 104. The end portion in the Z2 direction of each memory pillar MP is in contact with the semiconductor layer 105. The memory pillars MP each include, for example, a semiconductor and an insulator. The semiconductor is in contact with the semiconductor layer 104. One memory pillar MP corresponds to one NAND string NS. The memory pillars MP will be described later in detail. The end portion in the Z1 direction of the memory pillar MP is coupled to the interconnect layer 115 with the contact plugs 113 and 114 intervening therebetween. The interconnect layer 115 electrically coupled to the memory pillar MP function as the bit line BL.

The interconnect layer 115 is electrically coupled to the electrode pad 120 with, for example, the contact plug 116, the interconnect layer 117, and the contact plug 118 intervening therebetween. The electrode pad 120 is used in coupling to the circuit chip 200.

The insulating layer 102 is in contact with the insulating layer 119 in the Z1 direction. The plurality of electrode pads 120 are provided inside the insulating layer 119.

The plurality of members SLT extend in the Z direction and each divide the plurality of interconnect layers 101 in the Y direction. In other words, the members SLT are each provided between the plurality of interconnect layers 101 arranged side by side in the Y direction. The members SLT face the semiconductor layers 104 and 105 in the Z2 direction. The members SLT each include, for example, an insulator and conductor. The members SLT will be described later in detail.

The plurality of members SHE extend in the Z direction and divide in the Y direction the lowermost interconnect layer 101 that functions as the select gate line SGD in the Z2 direction. In other words, the members SHE are each provided between the plurality of interconnect layer 101 portions that function as the select gate lines SGD arranged side by side in the Y direction. The members SHE each include, for example, an insulator. The members SHE will be described later in detail. In a case where a plurality of interconnect layers 101 each functioning as the select gate line SGD are provided, they are divided in the Y direction by each of these members SHE.

Each of the areas divided by the members SLT and SHE corresponds to one string unit SU.

In the contact area, the interconnect layer 109 is electrically coupled to the electrode pad 120 with the contact plugs 112 to 114, the interconnect layer 115, the contact plug 116, the interconnect layer 117, and the contact plug 118 intervening therebetween. A part in the Z1 direction of the interconnect layer 109 is in contact with the insulating layer 108. A part of the insulating layer 108 is in contact with the semiconductor layer 103, the insulating layer 106, the semiconductor layer 105, and the insulating layer 107.

In the pad area, the interconnect layer 109 is electrically coupled to the electrode pad 120 with the contact plugs 112 to 114, the interconnect layer 115, the contact plug 116, the interconnect layer 117, and the contact plug 118 intervening therebetween. A part in the Z2 direction of the interconnect layer 109 is not covered with the passivation layer 111. This part functions as an electrode pad coupled to an external device. A part in the Z1 direction of the interconnect layer 109 is in contact with the insulating layer 108. A part of the insulating layer 108 is in contact with the semiconductor layer 103, the insulating layer 106, the semiconductor layer 105, and the insulating layer 107.

The interconnect layers 101, 109, 115, and 117 are formed of a conductive material such as a metallic material, a p-type semiconductor, or an n-type semiconductor. The semiconductor layers 103 to 105 include, for example, silicon. The contact plugs 112 to 114, 116, and 118 are formed of a conductive material such as a metallic material, a p-type semiconductor, or an n-type semiconductor. The electrode pad 120 is formed of a conductive material such as a metallic material. The electrode pad 120 includes, for example, copper (Cu). The insulating layers 102, 107, 108, 110, and 119 are formed of an insulating material and include, for example, silicon oxide (SiO). The insulating layer 106 is formed of an insulating material and includes, for example, silicon nitride (SiN). The passivation layer 111 includes, for example, polyimide.

The circuit chip 200 includes the sequencer 13, the driver module 14, the row decoder module 15, the sense amplifier module 16, and various interconnects for coupling them.

More specifically, the circuit chip 200 includes a semiconductor substrate 201, a plurality of transistors TR, an interconnect layer 204, a plurality of contact plugs 205, an interconnect layer 206, a plurality of contact plugs 207, insulating layers 208 and 209, and a plurality of electrode pads 210.

The plurality of transistors TR are used for the sequencer 13, the driver module 14, the row decoder module 15, the sense amplifier module 16, etc. The transistor TR includes a gate insulating film (not shown) provided on the semiconductor substrate 201, the gate electrode 202 provided on the gate insulating film, and a source and a drain (both not shown) formed in the semiconductor substrate 201. Each of the source and the drain is electrically coupled to the interconnect layer 204 with the contact plug 203 intervening therebetween. The gate electrode 202 is electrically coupled to the interconnect layer 204 with a contact plug (not shown) intervening therebetween. The interconnect layer 204 is electrically coupled to the electrode pad 210 with the contact plug 205, the interconnect layer 206, and the contact plug 207 intervening therebetween. The electrode pad 210 is used in coupling to the array chip 100.

The insulating layer 208 is provided on the semiconductor substrate 201. The insulating layer 209 is provided on the insulating layer 208. The plurality of electrode pads 210 are provided inside the insulating layer 209. The plurality of electrode pads 210 are electrically coupled to the plurality of electrode pads 120 of the array chip 100, respectively.

The gate electrode 202, the contact plugs 203, 205, and 207, and the interconnect layers 204 and 206 are formed of a conductive material such as a metallic material, a p-type semiconductor, or an n-type semiconductor. The electrode pad 210 is formed of a conductive material such as a metallic material. The electrode pad 210 includes, for example, copper. The insulating layers 208 and 209 are formed of an insulating material and include, for example, silicon oxide.

With the bonding configuration in which the array chip 100 and the circuit chip 200 are bonded together as described in the above, the electrode pads 210 are coupled to the electrode pads 120. For example, when Cu is used for the electrode pads 210 and the electrode pads 120, Cu in the electrode pads 210 is integrated with Cu in the electrode pads 120, thereby making it difficult to recognize a boundary between Cu in the electrode pads 210 and Cu in the electrode pads 120. However, the bonding configuration can be recognized according to distortion in the shape of the electrode pads 210 and the electrode pad 120 bonded together, which is caused by displacement in bonding, and displacement of a barrier metal of Cu (occurrence of a discontiguous site in a side surface). Furthermore, in the case of forming the electrode pads 210 and 120 by a damascene method, the side surface of each pad has a tapered shape. For this reason, the cross-sectional shape in the Z direction of a portion in which the electrode pad 210 is bonded to the electrode pad 120 shows that the side wall is shaped into a non-rectangular form, not a straight form. Furthermore, in the case of bonding the electrode pads 210 to the electrode pads 120, the bottom surface, the side surface, and the upper surface of Cu forming each of these pads are covered with a barrier metal. On the other hand, in a general interconnect layer using Cu, an insulating layer (SiN or SiCN, etc.) having a function of preventing oxidation of Cu is formed on the upper surface of Cu, and no barrier metal is provided. Therefore, even without the event of displacement in bonding, the above configuration is distinguishable from a general interconnect layer.

1.1.5 Planar Structure of Array Chip

An example of a planar structure in the array area of the array chip 100 will be described.

Figure 4:
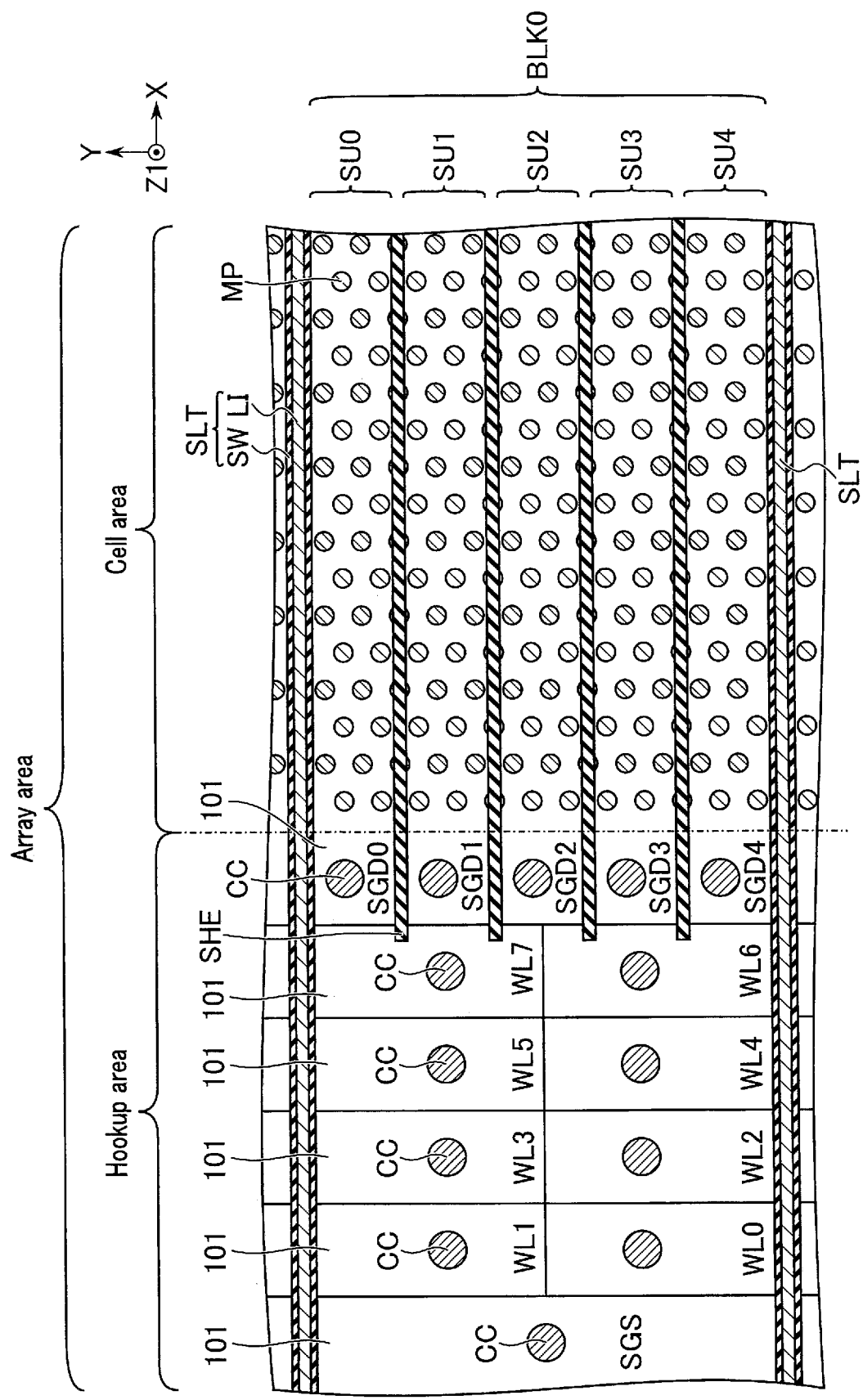
FIG. 4 is a plan view showing an example of a planar structure when viewed from an upper surface in a Z1 direction in an array area of the semiconductor memory device according to the first embodiment.

First, the planar structure when viewed from an upper surface in the Z1 direction will be described with reference to FIG. 4. FIG. 4 is a plan view showing an example of the planar structure in the array area of the array chip 100 when viewed from the upper surface in the Z1 direction. FIG. 4 shows a part of the array area of the block BLK0. FIG. 4 omits an interlayer insulating layer.

The array area includes an area including a plurality of NAND strings NS (hereinafter referred to as a "cell area") and an area for use in coupling between the plurality of interconnect layers 101 and the circuit chip 200 (hereinafter referred to as a "hookup area").

In the hookup area, the interconnect layers 101 (select gate lines SGS and SGD and word lines WL0 to WL7) respectively have terrace portions. The example of FIG. 4 shows the case in which the end portions of the word lines WL0 to WL7 are formed in a double-row staircase shape having one step in the Y direction and multiple steps in the X direction. To be more specific, each even-numbered word line WL (word lines WL0, WL2, WL4, and WL6) and each odd-numbered word line WL (word lines WL1, WL3, WL5, and WL7) have one step in the Y direction. The two word lines WL whose terrace portions are adjacent in the X direction have two steps in the X direction. In the block BLK0, for example, the terrace portions of the even-numbered word lines WL are positioned on the lower side of the drawing sheet, and the terrace portions of the odd-numbered word lines WL are positioned on the upper side of the drawing sheet. As described in the above, the hookup area has a staircase portion in which the respective end portions of the select gate lines SGS and SGD and the word lines WL0 to WL7 are drawn out in a stepwise manner.

The contact plugs CC are provided on the terrace portions of the select gate lines SGS and SGD and the word lines WL0 to WL7. The contact plugs CC electrically couple the select gate lines SGS and SGD and the word lines WL0 to WL7 to the interconnect layer 115. The contact plug CC is formed of a conductive material and includes, for example, tungsten.

In the cell area, the plurality of memory pillars MP are arranged, for example, in a staggered pattern.

The plurality of members SLT are arranged side by side in the Y direction. The member SLT extends in the X direction and crosses the hookup area and the cell area. The member SLT is formed into a linear shape. One block BLK is arranged between the two members SLT arranged in the Y direction. That is, each member SLT is provided between the two blocks BLK adjacent in the Y direction.

The member SLT includes a contact plug LI and an insulator SW. For example, the contact plug LI is formed into a linear shape extending in the X direction. The contact plug LI is formed of a conductive material and includes, for example, tungsten. The insulator SW is provided on a side surface of the contact plug LI. In other words, the contact plug LI is surrounded by the insulators SW in a plan view (when viewed in the Z2 direction). Therefore, the contact plug LI is not in contact with the plurality of interconnect layers 101. The insulator SW is formed of an insulating material and includes, for example, silicon oxide. The contact plugs LI may not be in contact with the source line SL. The member SLT may not include the contact plug LI.

The plurality of members SHE are arranged side by side in the Y direction. The member SHE extends in the X direction and crosses the cell area. One end of each member SHE is included in the hookup area. The member SHE is formed into a linear shape. The member SHE is formed of an insulating material and includes, for example, silicon oxide. That is, the member SHE includes an insulating material and no conductive material.

The members SLT and SHE divide the block BLK0 into five string units SU0 to SU4 and the select gate line SGD into five portions (SGD0 to SGD4).

Next, the planar structure of the semiconductor layer 104 when viewed from the upper surface in the Z2 direction will be described with reference to FIG. 5. FIG. 5 is a plan view showing an example of the planar structure in the array area of the array chip 100 when viewed from the upper surface in the Z2 direction. FIG. 5 shows a part of the array area of the block BLK0. FIG. 5 omits an interlayer insulating layer. The following description will be given focusing on a layout of the members DST.

In the cell area, a plurality of members DST which correspond to a part of the semiconductor layer 104 (hereinafter, also referred to as "members DST1") are arranged side by side in the Y direction. Each member SLT is arranged below each member DST1 and overlaps the member DST1 in the Z direction. In other words, the member DST1 is arranged in a position facing the member SLT with the semiconductor layer 103 intervening therebetween in the Z direction. That is, the plurality of interconnect layers 101 are not provided below the member DST1. The member DST1 extends in the X direction and crosses the cell area. One end of the member DST1 is included in the hookup area. The member DST1 is formed into a linear shape. No memory pillar MP is arranged below the member DST1 in the Z direction. The length of the member DST1 in the X direction may be substantially equal to or smaller than that of the member SLT. It suffices that the member DST1 extends from at least one end portion in the X direction of the cell area to the other end portion.

1.1.6 Cross-sectional Structure of Array Chip

An example of the cross-sectional structure in the array area of the array chip 100 will be described.

Figure 6:
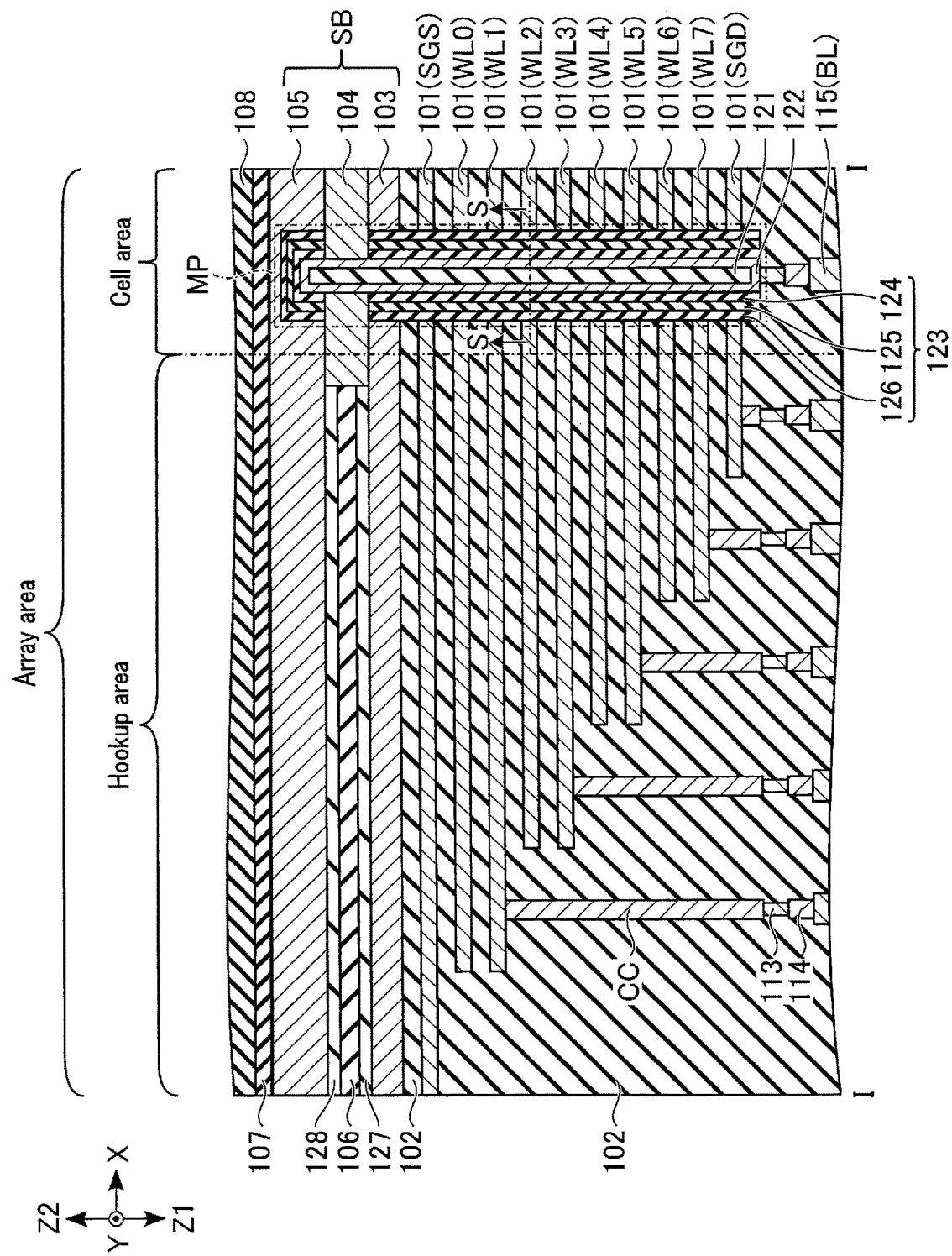
FIG. 6 is a cross-sectional view taken along line I-I of FIG. 5 and shows an example of a cross-sectional structure in the array area of the semiconductor memory device according to the first embodiment.

FIG. 6 is a cross-sectional view taken along line I-I of FIG. 5 and shows an example of a cross-sectional structure in the array area of the array chip 100. FIG. 6 shows the hookup area and a part of the cell area. FIG. 6 omits the interconnect layer 109, the insulating layer 110, the passivation layer 111, the plurality of contact plugs 116, the interconnect layer 117, the plurality of contact plugs 118, the insulating layer 119, and the plurality of electrode pads 120.

In the hookup area, the terrace portions of the plurality of interconnect layers 101 (the select gate lines SGS and SGD and the word lines WL0 to WL7) are provided in a stepwise manner. The plurality of contact plugs CC are respectively provided on the terrace portions of the interconnect layers 101 in the Z1 direction. The contact plugs 113 and 114 and the interconnect layer 115 are stacked on each of the contact plugs CC in the Z1 direction. Each interconnect layer 115 is electrically coupled to one of the interconnect layers 101, with the contact plugs CC, 113, and 114 intervening therebetween.

In the cell area, the memory pillar MP extends in the Z direction and penetrates through the interconnect layers 101 and the semiconductor layers 103 and 104. The end portion in the Z2 direction of the memory pillar MP is in contact with the semiconductor layer 105 (layer stack SB containing the semiconductor layers 103 to 105 each functioning as the source line SL). The end portion in the Z1 direction of the memory pillar MP is coupled to the interconnect layer 115 with the contact plugs 113 and 114 intervening therebetween.

The portion in which the memory pillar MP intersects the interconnect layer 101 (select gate line SGS) functions as the select transistor ST2. The portion in which the memory pillar MP intersects one of the interconnect layers 101 (word lines WL0 to WL7) functions as one memory cell transistor MT. In other words, the memory cell transistors MT are respectively formed in the portions in which the plurality of memory pillars MP intersect one of the interconnect layers 101 (word lines WL0 to WL7). The portion in which the memory pillar MP intersects the interconnect layer 101 (select gate line SGD) functions as the select transistor ST1. In other words, the select transistors ST1 are respectively formed in the portions in which the memory pillar MP intersects one of the plurality of interconnect layers 101 (select gate lines SGD0 to SGD4).

The memory pillar MP includes, for example, a core film 121, a semiconductor film 122, and a stacked film 123.

The core film 121 extends in the Z direction. For example, in the Z1 direction, the lower end of the core film 121 is located below the lowermost interconnect layer 101, and the upper end of the core film 121 is located above the semiconductor layer 104. The core film 121 is formed of an insulating material and includes, for example, silicon oxide.

The semiconductor film 122 covers the periphery of the core film 121. At the end portion in the Z1 direction of the memory pillar MP, a part of the semiconductor film 122 is in contact with the semiconductor layer 104. The semiconductor film 122 includes, for example, silicon. One end of the semiconductor layer 104 is included in the hookup area.

The stacked film 123 covers the side and bottom surfaces of the semiconductor film 122 except for the portion in which the semiconductor film 122 and the semiconductor layer 104 are in contact with each other. The stacked film 123 includes, for example, a tunnel insulating film, a charge storage layer, and a block insulating film arranged in this order. For example, in the case of the memory cell transistor MT being of a metal-oxide-nitride-oxide-silicon (MONOS) type, the charge storage layer is an insulating film. In the case of the memory cell transistor MT being of a Floating Gate (FG) type, the charge storage layer is a conductor. The following will describe, as an example, a case in which the memory cell transistor MT is of the MONOS type. The stacked film 123 includes, for example, an insulating layer 124, an insulating layer 125, and an insulating layer 126 arranged in this order.

FIG. 7 is a cross-sectional view taken along line S-S of FIG. 6 and shows an example of the cross-sectional structure of the memory pillar MP. Specifically, FIG. 7 shows a cross-sectional structure of each memory pillar MP in a layer that is parallel to the surface of the semiconductor substrate 201 and includes the interconnect layer 101.

The insulating layer 124 covers the periphery of the semiconductor film 122. The insulating layer 124 functions as a tunnel insulating film for the memory cell transistor MT. The insulating layer 124 is formed of an insulating material and includes, for example, silicon oxide. The insulating layer 125 covers the periphery of the insulating layer 124. The insulating layer 125 functions as a charge storage layer for the memory cell transistor MT. The insulating layer 125 is formed of an insulating material and includes, for example, silicon nitride. The insulating layer 126 covers the periphery of the insulating layer 125. The insulating layer 126 functions as a block insulating film for the memory cell transistor MT. The insulating layer 126 is formed of an insulating material and includes, for example, silicon oxide. The interconnect layer 101 covers the periphery of the insulating layer 126.

As shown in FIG. 6, the insulating layer 102, the semiconductor layers 103 to 105, and the insulating layers 107 and 108 are stacked on the uppermost interconnect layer 101 in the Z2 direction. In the present embodiment, the source lines SL (semiconductor layers 103 to 105) are formed by disposing, with the use of a sacrificial layer, a structure corresponding to the semiconductor layer 104 between the semiconductor layer 103 and the semiconductor layer 105, and thereafter replacing the sacrificial layer with the semiconductor layer 104. As a sacrificial layer, for example, a stacked film including the insulating layers 106, 127, and 128 is used. The insulating layers 127 and 128 are formed of an insulating material and include, for example, silicon oxide. Portions of the insulating layers 106, 127, and 128 remain without being removed when forming the semiconductor layer 104. In other words, the insulating layers 106, 127, and 128 are formed between the semiconductor layer 103 and the semiconductor layer 105 and are formed in the same layer as the semiconductor layer 104.

Figure 8:
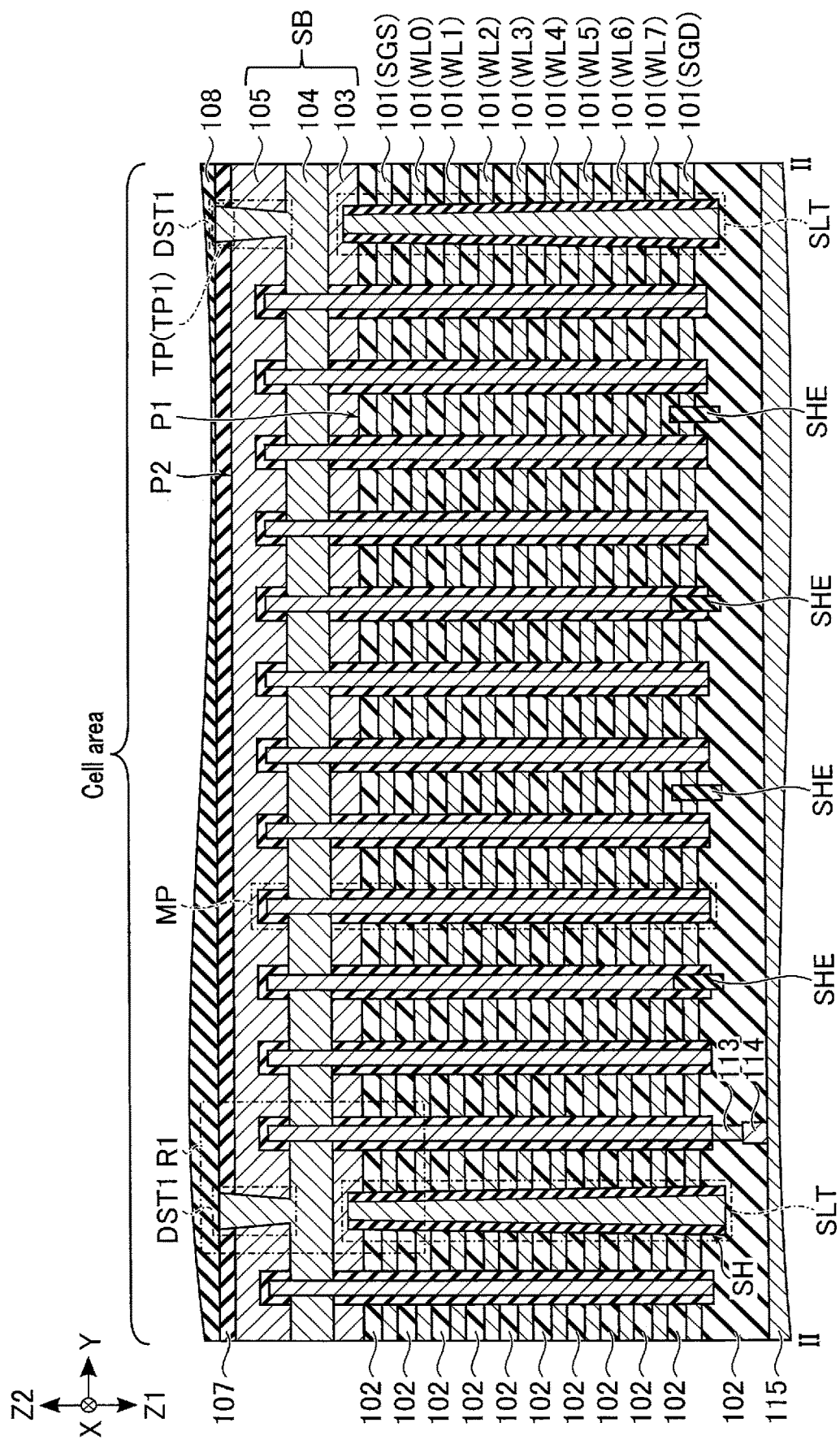
FIG. 8 is a cross-sectional view taken along line II-II of FIG. 5 and shows an example of a cross-sectional structure in the array area of the semiconductor memory device according to the first embodiment.

FIG. 8 is a cross-sectional view taken along line II-II of FIG. 5 and shows an example of the cross-sectional structure in the array area of the array chip 100. FIG. 8 shows a part of the cell area. FIG. 8 omits the interconnect layer 109, the insulating layer 110, the passivation layer 111, the plurality of contact plugs 116, the interconnect layer 117, the plurality of contact plugs 118, the insulating layer 119, and the plurality of electrode pads 120.

Each of the members SLT divides the plurality of interconnect layers 101 in the two blocks BLK adjacent in the Y direction. The end in the Z2 direction of the member SLT is in contact with the semiconductor layer 103. In other words, the end portion in the Z2 direction of the member SLT is in contact with the layer stack SB containing the semiconductor layers 103 to 105. The end in the Z2 direction of each member SLT is not in contact with the semiconductor layers 104 and 105. Each member SLT is embedded in each slit SH. The slit SH extends in the Z direction and divides the plurality of interconnect layers 101. The end in the Z2 direction of the slit SH reaches the semiconductor layer 103. The end in the Z2 direction of the slit SH does not reach the semiconductor layers 104 and 105.

Each of the member SHE divides the interconnect layer 101 (the select gate line SGD) into the interconnect layer 101 portions adjacent in the Y direction and does not divide the plurality of interconnect layers 101 (the word lines WL and the select gate lines SGS). FIG. 8 shows an example in which the end portion in the Z1 direction of the memory pillar MP is also provided with the member SHE. The memory pillar MP coupled to the member SHE is a dummy pillar. The dummy pillar may not be provided.

The semiconductor layer 104 has a portion (member DST1) penetrating through the semiconductor layer 105 and the insulating layer 107 in the Z2 direction, and the end in the Z2 direction of this portion is in contact with the insulating layer 108. The member DST1 is provided in a position in which it overlaps the member SLT in the Z direction. In other words, the layer stack SB containing the semiconductor layers 103 to 105 has a projecting portion TP (hereinafter, also referred to as a "projecting portion TP1") on the side of a second surface P2 facing a first surface P1 in contact with the member SLT. The projecting portion TP1 projects in the Z direction and overlaps, in the Z direction, a part of an area provided with the interconnect layer 101 and the member SLT. In the layer stack SB containing the semiconductor layers 103 to 105, a portion positioned between the first surface P1 and the second surface P2 and the projecting portion TP1 are integrally formed. The projecting portion TP1 is formed into a linear shape extending in the X direction. The projecting portion TP1 is configured in such a manner that its longitudinal direction is set to the X direction. The projecting portion TP1 projects in the Z direction in a position in which it overlaps the member SLT in the Z direction within the area provided with the interconnect layers 101 and the member SLT. The projecting portion TP1 faces (overlaps) the member SLT in the Z direction and does not face the memory pillar MP.

1.2 Method of Manufacturing Semiconductor Memory Device

Figure 9:
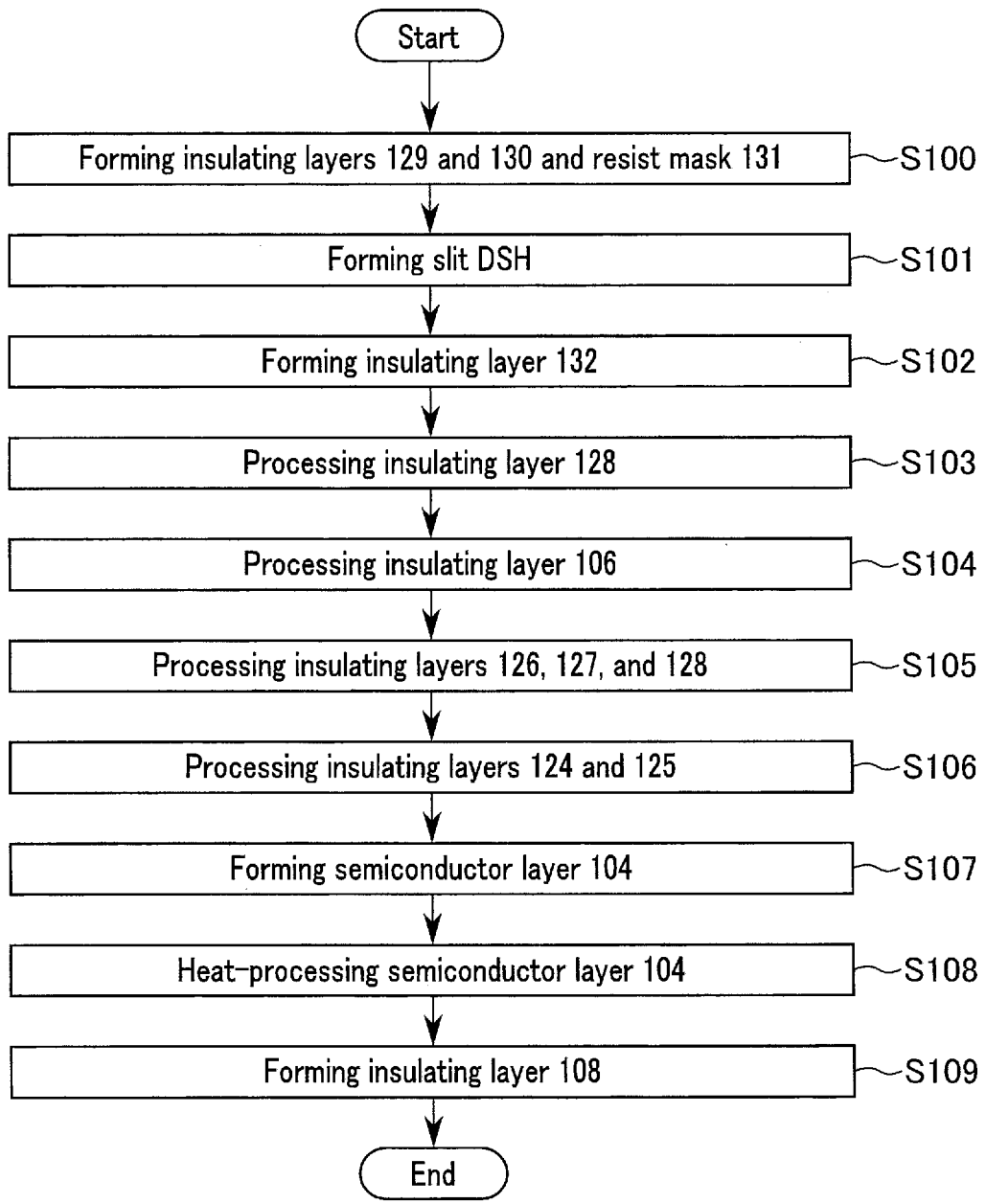
FIG. 9 is a flowchart showing an example of a method of manufacturing the semiconductor memory device according to the first embodiment.

Next, a method of manufacturing the semiconductor memory device 3 will be described. The following will describe a process of manufacturing the semiconductor memory device 3 after the array chip 100 and the circuit chip 200 are bonded together. FIG. 9 is a flowchart showing an example of the method of manufacturing the semiconductor memory device 3. FIG. 10 to FIG. 18 are each a cross-sectional view showing an example of a cross-sectional structure during the process of manufacturing the semiconductor memory device 3. In FIG. 10 to FIG. 18, an area R1 within the cell area of the array chip 100 in FIG. 8 is enlarged.

As shown in FIG. 9, steps S100 to S109 are sequentially executed during the process of manufacturing the semiconductor memory device 3. An exemplary process of manufacturing the semiconductor memory device 3 will be described by suitably referring to FIG. 9. The following description will in principle concentrate on a partial area (area R1 in FIG. 8) within the cell area of the array chip 100.

Figure 10:
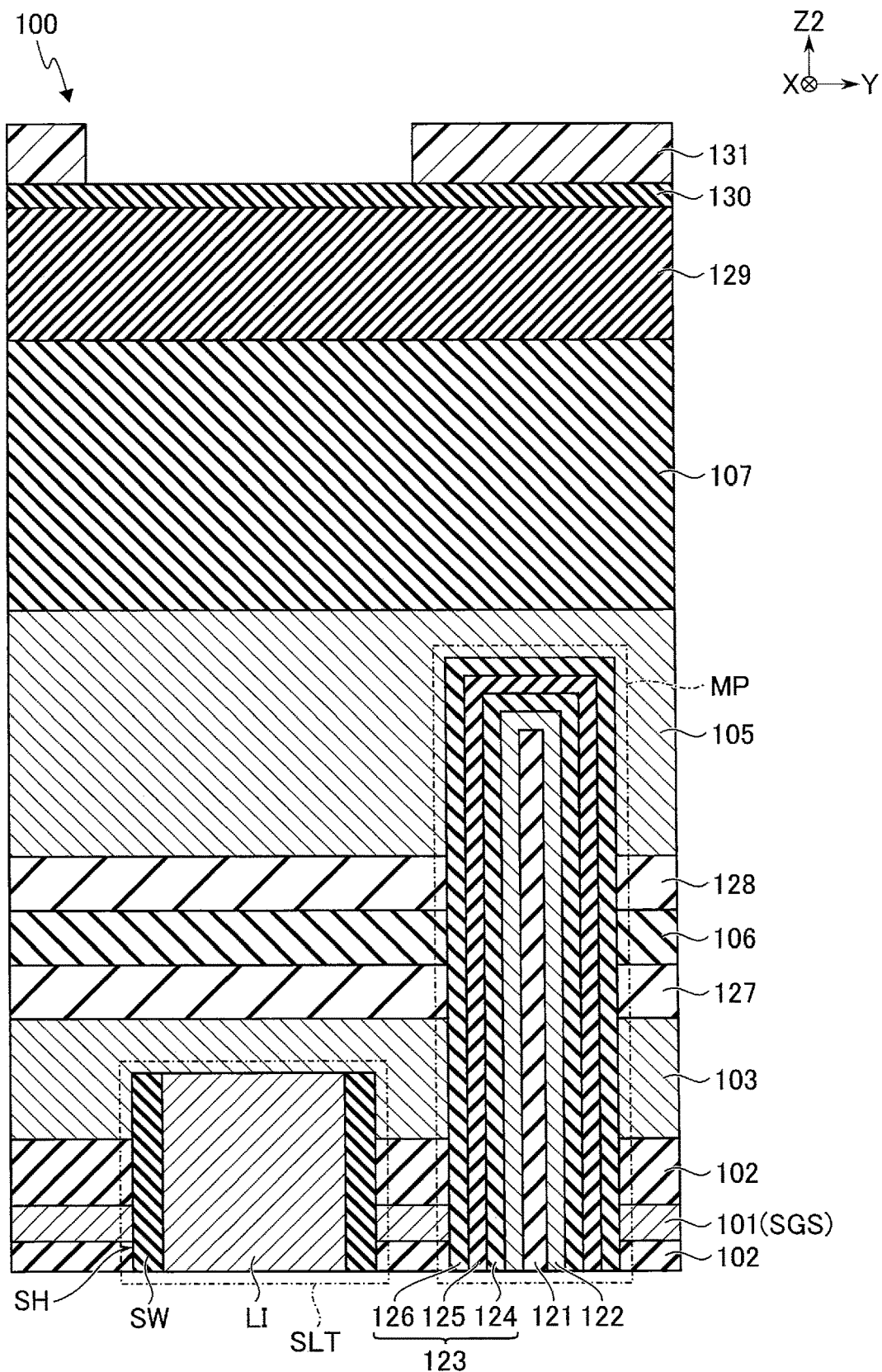
FIG. 10 is a cross-sectional view showing an example of a cross-sectional structure during a process of manufacturing the semiconductor memory device according to the first embodiment.

After the array chip 100 and the circuit chip 200 are bonded together, the substrate of the array chip 100 is removed. Next, as shown in FIG. 10, insulating layers 129 and 130 and a resist mask 131 are formed (S100). For example, the insulating layers 129 and 130 are formed on the insulating layer 107 provided on the semiconductor layer 105 in the Z2 direction. Thereafter, a resist mask 131 is formed by photolithography, etc., on the insulating layer 130. In the resist mask, a pattern for forming the semiconductor layer 104 is opened in a position facing the member SLT in the Z direction. The insulating layer 129 is formed of an insulating material and is, for example, spin on carbon (SOC). The insulating layer 130 is formed of an insulating material and is, for example, spin on glass (SOG).

Figure 11:
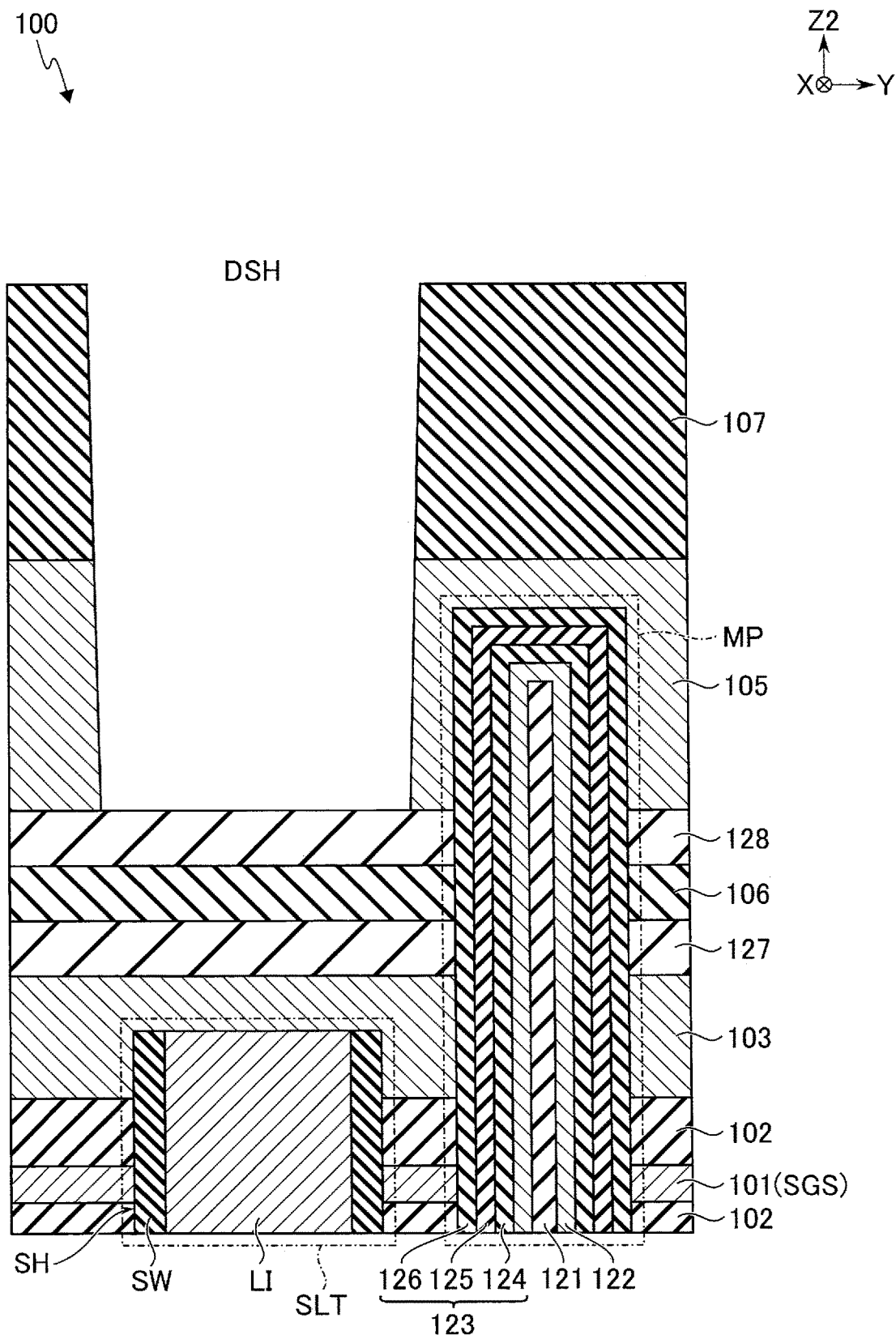
FIG. 11 is a cross-sectional view showing an example of a cross-sectional structure during a process of manufacturing the semiconductor memory device according to the first embodiment.

Next, as shown in FIG. 11, the slit DSH is formed (S101). For example, the insulating layer 107 and the semiconductor layer 105 are processed through anisotropic etching by Reactive Ion Etching (RIE). At this time, the amount of etching is set such that the insulating layer 128 is exposed and the insulating layer 106 is not exposed on the bottom surface of the slit DSH. The insulating layers 129 and 130 and the resist mask 131 function as a mask during formation of the slit DSH and do not remain after processing of the insulating layer 107 and the semiconductor layer 105 is completed.

Next, as shown in FIG. 12, in order to protect the side wall of the slit DSH, the insulating layer 132 is formed (S102). The insulating layer 132 is formed of an insulating material and includes, for example, silicon oxide.

Figure 13:
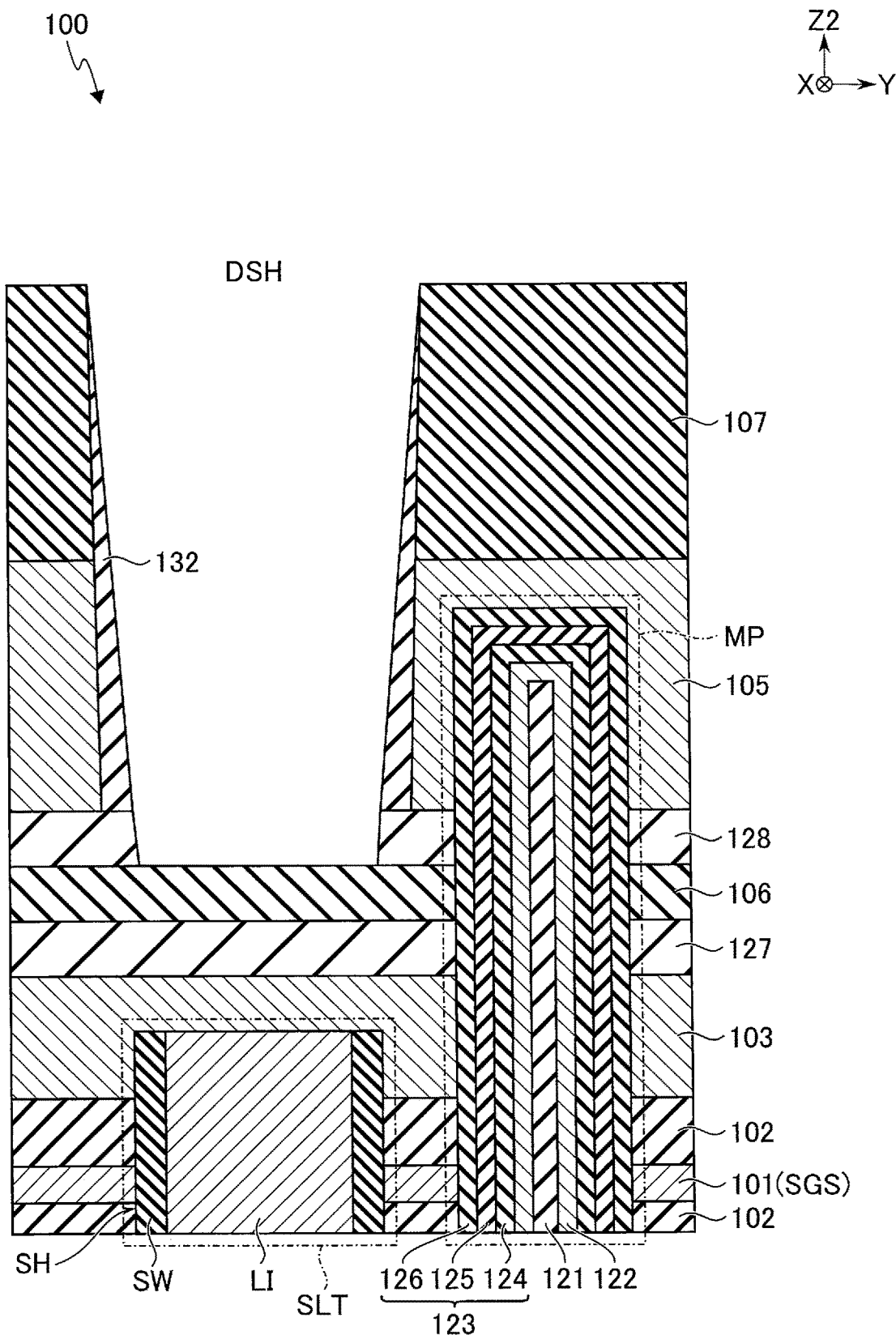
FIG. 13 is a cross-sectional view showing an example of a cross-sectional structure during a process of manufacturing the semiconductor memory device according to the first embodiment.

Next, as shown in FIG. 13, the insulating layer 128 is processed (S103). For example, the insulating layers 132 and 128 are processed through anisotropic etching by RIE. At this time, the amount of etching is set such that the insulating layer 106 is exposed and the insulating layer 127 is not exposed on the bottom surface of the slit DSH.

Next, as shown in FIG. 14, the insulating layer 106 is processed (S104). For example, isotropic etching by wet etching with the use of phosphoric acid is performed. By this, the insulating layer 106 is etched from the side surface of the slit DSH. At this time, a part of the insulating layer 106 remains without being removed in accordance with the distance from the slit DSH.

Next, as shown in FIG. 15, the insulating layers 126, 127, and 128 are processed (S105). For example, isotropic etching by wet etching with the use of hydrofluoric acid is performed. By this, the insulating layers 127 and 128 and the insulating layer 126 of the memory pillar MP are etched from the side surface of the slit DSH. At this time, a part of the insulating layer 126, 127, and 128 remains without being removed in accordance with the distance from the slit DSH.

Figure 16:
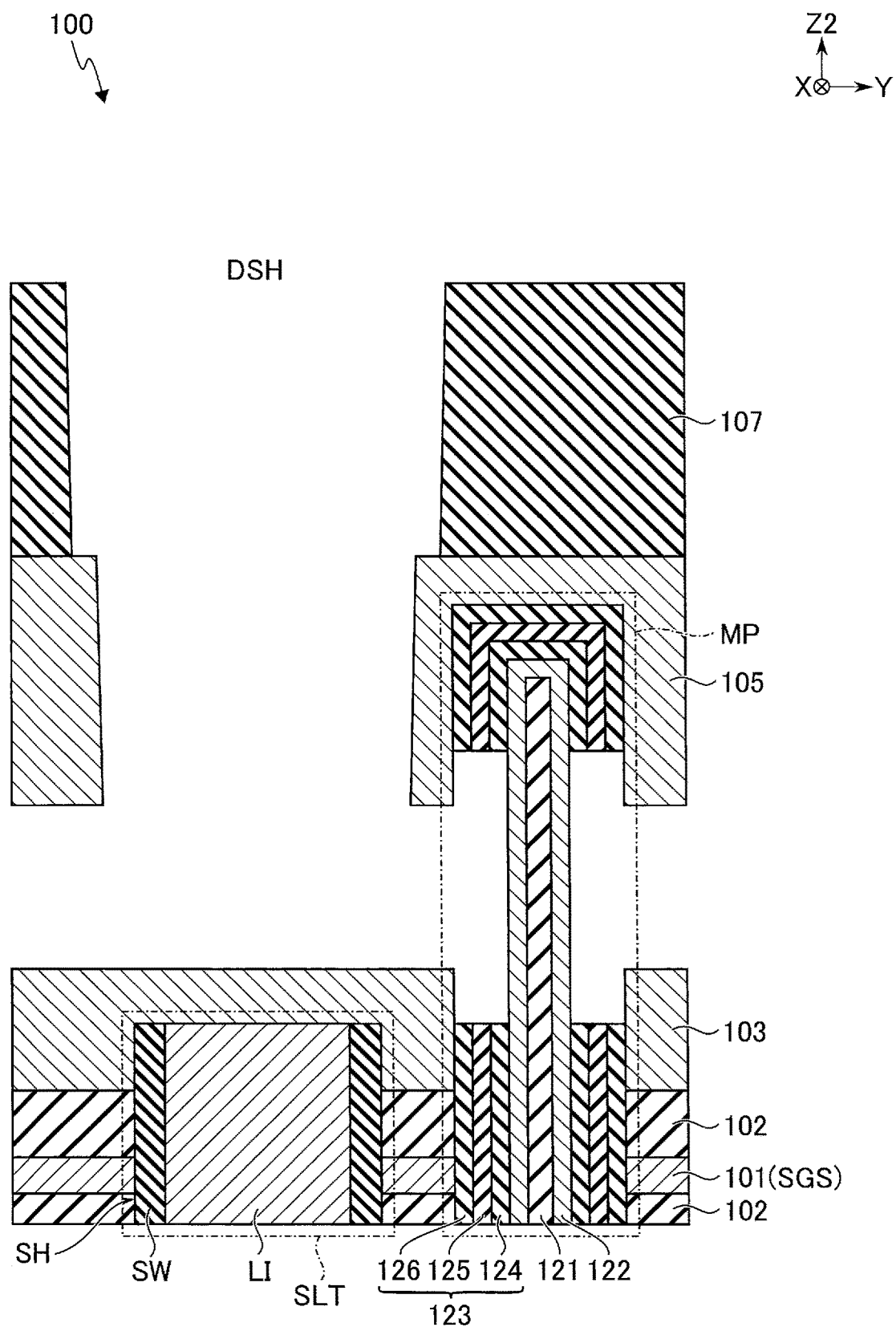
FIG. 16 is a cross-sectional view showing an example of a cross-sectional structure during a process of manufacturing the semiconductor memory device according to the first embodiment.

Next, as shown in FIG. 16, the insulating layers 124 and 125 are processed (S106). For example, the insulating layer 125 is processed through isotropic etching by wet etching with the use of phosphoric acid. At this time, a part of the insulating layer 125 remains without being removed in accordance with the distance from the slit DSH. Next, the insulating layer 124 is processed through isotropic etching by Chemical Dry Etching (CDE). At this time, a part of the insulating layer 124 remains without being removed in accordance with the distance from the slit DSH.

Next, as shown in FIG. 17, the semiconductor layer 104 is formed (S107). For example, the semiconductor layer 104 is formed through chemical vapor deposition (CVD). For example, as the semiconductor layer 104, amorphous silicon doped with phosphorus is formed. By this, the slit DSH and the area from which the insulating layers 106, and 124 to 128 have been removed is filled with the semiconductor layer 104. Thereafter, for example, the semiconductor layer 104 on the insulating layer 107 is removed through Chemical Mechanical Polishing (CMP), etc. Hereinafter, a process of replacing the area from which the insulating layers 106, and 124 to 128 have been removed with the semiconductor layer 104 will be referred to as "replacement". The formed semiconductor layer 104 has a portion (member DST1) penetrating through the semiconductor layer 105 and the insulating layer 107 in the Z2 direction. The member DST1 has a projecting portion TP1 that projects toward the insulating layer 107 from the semiconductor layer 105.

Next, for example, heat treatment (heat-processing) is performed on the semiconductor layer 104 by laser annealing (S108). The annealing process may not be performed.

Figure 18:
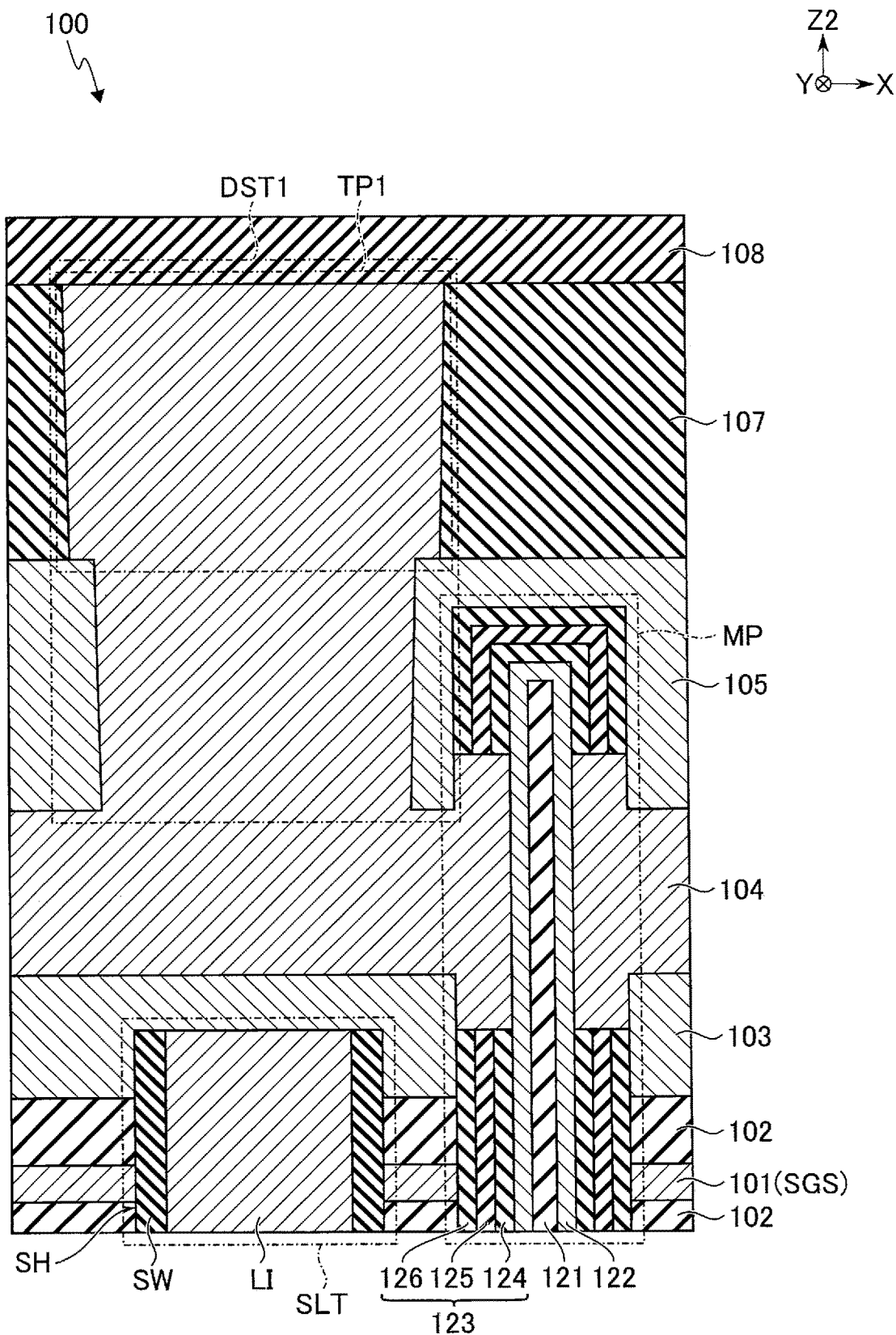
FIG. 18 is a cross-sectional view showing an example of a cross-sectional structure during a process of manufacturing the semiconductor memory device according to the first embodiment.

As shown in FIG. 18, the insulating layer 108 is formed (S109).

Through the manufacturing process described in the above, the semiconductor layer 104 of the semiconductor memory device 3 is formed. The manufacturing process described in the above is merely an example and is not limited thereto. For example, another step may be inserted between the respective manufacturing steps or a part of the steps may be omitted or integrated. Furthermore, the respective manufacturing steps may be interchanged where possible.

1.3 Advantageous Effects of Present Embodiment

According to the first embodiment, the degree of difficulty in process can be reduced. The advantageous effect will be described below.

With the structure in which the array chip 100 and the circuit chip 200 are not bonded together, the replacement of the semiconductor layer 104 (source line SL) is executed through the slit SH. Therefore, in a case where the number of stacked interconnect layers 101 increases in accordance with the higher integration of the semiconductor memory device 3, aspect ratio enhancing of the slit SH is promoted, thereby making it difficult to execute the replacement of the semiconductor layer 104.

On the other hand, according to the present embodiment, after the array chip 100 and the circuit chip 200 are bonded together, the slit DSH is formed on the surface opposite to the surface on which the slit SH of the array chip 100 is to be formed. The replacement can be executed through the slit DSH. The replacement of the semiconductor layer 104 can be performed through the slit DSH, which is shallower in depth than the slit SH, so that the degree of difficulty in process can be reduced.

For example, in the case of processing the slits SH and DSH by RIE, a processing shape is generally a tapered shape (with a bottom smaller in shape). Thus, the cross-sectional area along the XY plane (XY plane cross-sectional area) decreases from the opening portion toward the bottom portion. According to the present embodiment, the slit DSH is shallower in depth than the slit SH and is therefore easier to process than the slit SH.

In the replacement of the semiconductor layer 104 through the slit SH, the side wall of the slit SH (a stacked structure of silicon oxide and silicon nitride before the formation of the interconnect layer 101 through the slit SH) is protected by forming three layers including, for example, the insulating layer, the semiconductor layer, and the insulating layer.

On the other hand, according to the present embodiment, the side wall of the slit DSH has a stacked structure including the semiconductor layer 105 and the insulating layer 107, and the side wall of the slit DSH can be protected by the insulating layer 132, which is a single layer. This can simplify the process.

Furthermore, in the replacement of the semiconductor layer 104 through the slit SH, for example, in order to form the plurality of interconnect layers 101 through the slit SH in a later step of the process, the entire slit SH is not filled with the semiconductor layer 104, and the semiconductor layer 104 within the slit SH is removed by etch-back.

On the other hand, according to the present embodiment, the replacement of the semiconductor layer 104 is performed after the formation of the plurality of interconnect layers 101, so that the slit DSH is filled with the semiconductor layer 104. This can simplify the process.

1.4 First Modification

The semiconductor memory device 3 according to a first modification of the first embodiment will be described. The semiconductor memory device 3 according to the present modification differs from the first embodiment in terms of the structure in the array area of the array chip 100. Hereinafter, the following description will in principle concentrate on the features different from the first embodiment.

1.4.1 Cross-Sectional Structure of Semiconductor Memory Device

Figure 19:
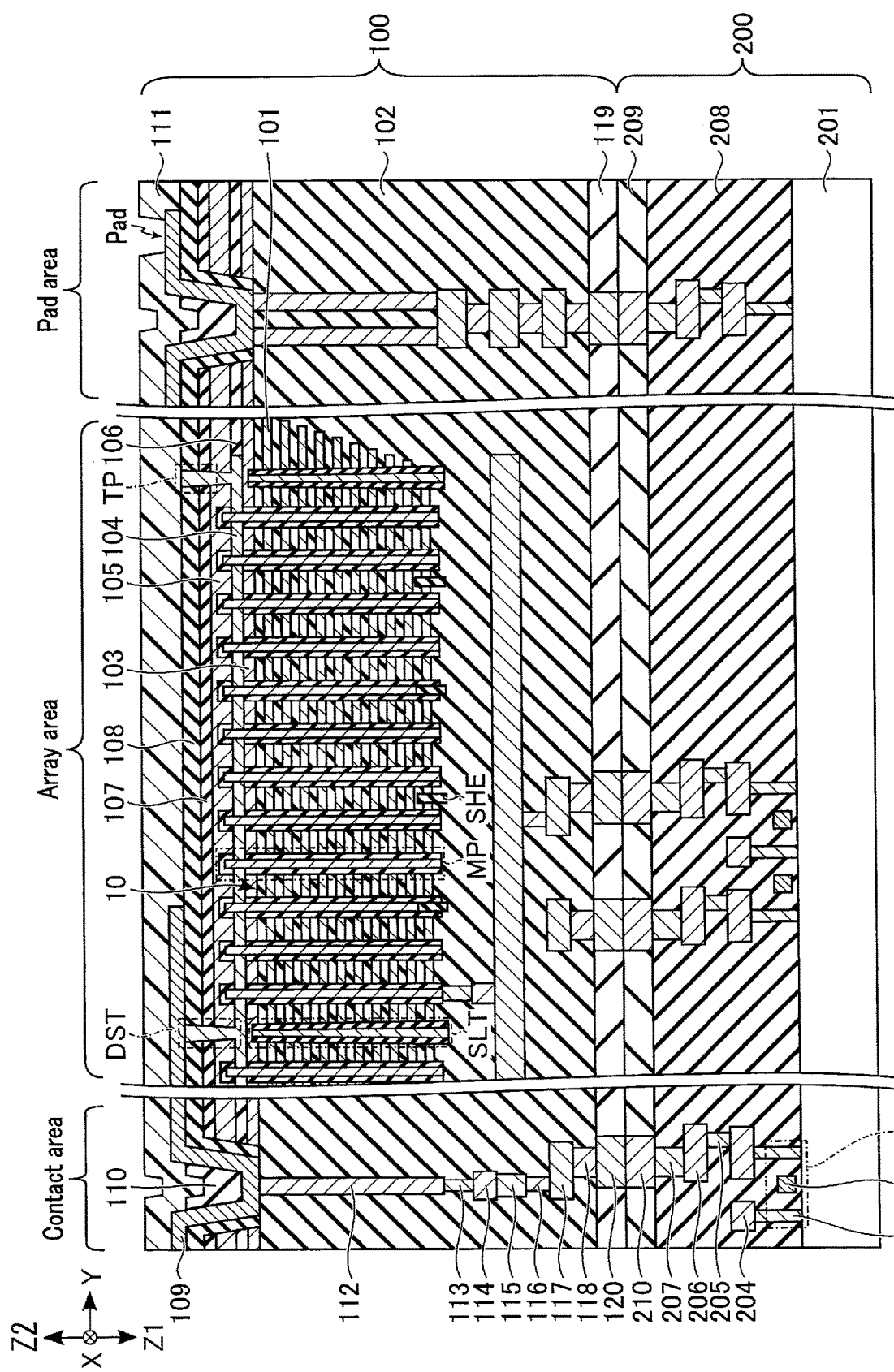
FIG. 19 is a cross-sectional view showing an example of a cross-sectional structure of a semiconductor memory device according to a first modification of the first embodiment.

An example of a cross-sectional structure of the semiconductor memory device 3 will be described with reference to FIG. 19. FIG. 19 is a cross-sectional view showing an example of a cross-sectional structure of the semiconductor memory device 3.

The array area of the array chip 100 will be described. The insulating layers 107 and 108, the interconnect layer 109, and the passivation layer 111 are provided on the semiconductor layer 105 in the Z2 direction. The semiconductor layer 104 has a portion (member DST) penetrating through the semiconductor layer 105 and the insulating layers 107 and 108 in the Z2 direction. A plurality of members DST include a member DST having its end in the Z2 direction in contact with the interconnect layer 109 and a member DST having its end in the Z2 direction in contact with the passivation layer 111. The interconnect layer 109 is in contact with the semiconductor layer 104 and the insulating layer 108 in the Z1 direction. In other words, the projecting portion TP of the layer stack containing the semiconductor layers 103 to 105 is in contact with the interconnect layer 109. The passivation layer 111 covers the semiconductor layer 104, the insulating layer 108, and the interconnect layer 109 in the Z2 direction. The rest of the structure in the array area of the array chip 100 is similar to that of the first embodiment. In other words, FIG. 3 shows the example in which the interconnect layer 109 is in contact with the semiconductor layer 105, thereby being electrically coupled to the semiconductor layers 103 to 105. On the other hand, FIG. 19 shows the example in which the interconnect layer 109 is electrically coupled to the semiconductor layers 103 to 105 with the member DST intervening therebetween.

1.4.2 Advantageous Effects of Present Modification

The configuration according to the present modification produces advantageous effects similar to those of the first embodiment.

1.5 Second Modification

The semiconductor memory device 3 according to a second modification of the first embodiment will be described. The semiconductor memory device 3 according to the present modification differs from the first embodiment in terms of the structure of the array area of the array chip 100. Hereinafter, the following description will in principle concentrate on the features different from the first embodiment.

1.5.1 Cross-Sectional Structure of Semiconductor Memory Device

Figure 20:
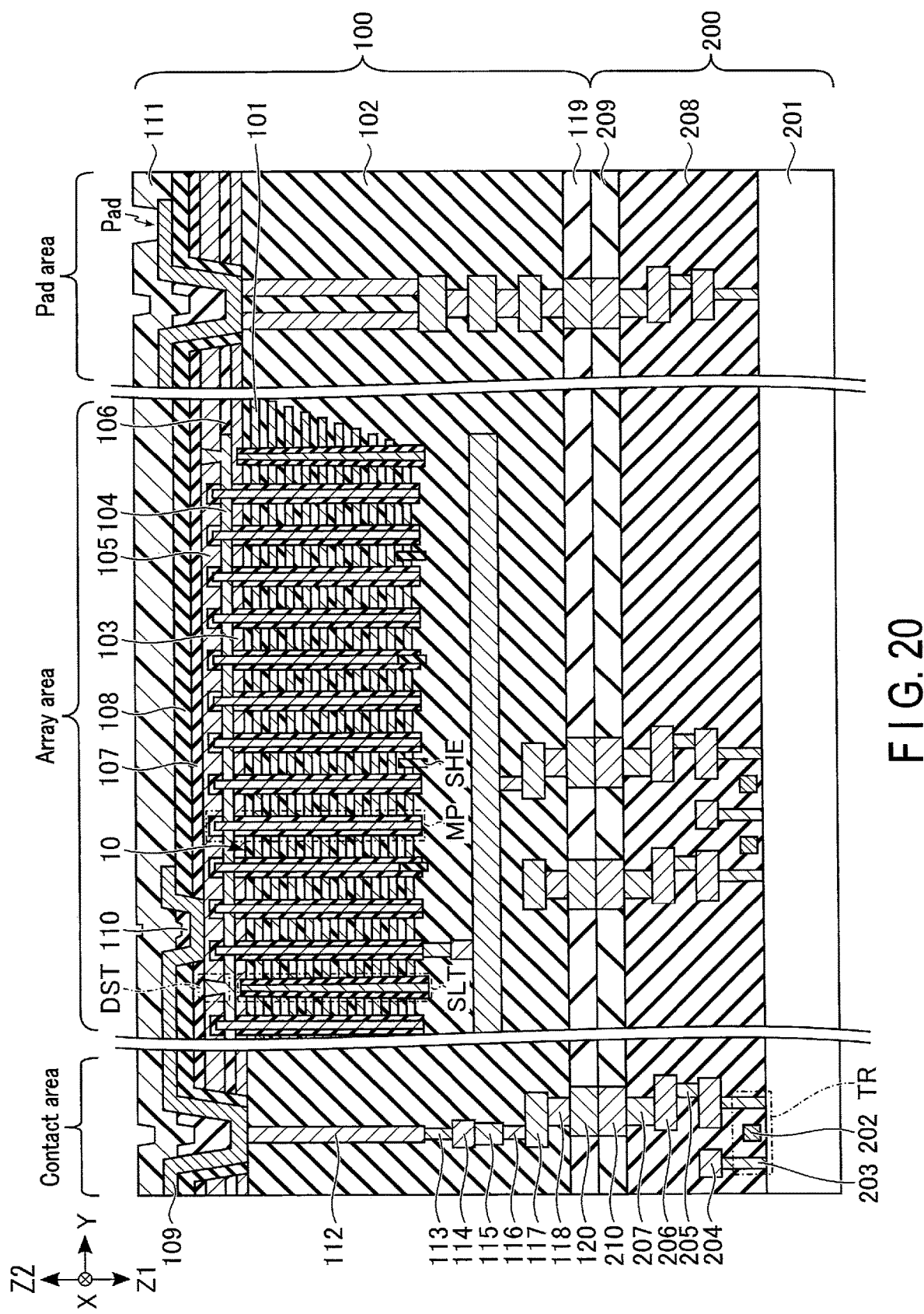
FIG. 20 is a cross-sectional view showing an example of a cross-sectional structure of a semiconductor memory device according to a second modification of the first embodiment.

An example of a cross-sectional structure of the semiconductor memory device 3 will be described with reference to FIG. 20. FIG. 20 is a cross-sectional view showing an example of a cross-sectional structure of the semiconductor memory device 3.

The array area of the array chip 100 will be described. The semiconductor layer 104 has a portion (member DST) penetrating through the semiconductor layer 105 in the Z2 direction, and the end in the Z2 direction of this portion is in contact with the insulating layer 107. The rest of the structure in the array area of the array chip 100 is similar to that of the first embodiment. That is, the member DST does not project from an upper surface of the semiconductor layer 105 in the Z2 direction.

1.5.2 Advantageous Effects of Present Modification

The configuration according to the present modification produces the advantageous effects similar to those of the first embodiment.

2. Second Embodiment

A semiconductor memory device according to a second embodiment will be described. The semiconductor memory device 3 according to the present embodiment differs from the first embodiment in terms of a layout of the member DST in the cell area of the array chip 100. Hereinafter, the following description will in principle concentrate on the features different from the first embodiment.

2.1 Planar Structure of Array Chip

An example of a planar structure in the array area of the array chip 100 will be described.

The planar structure when viewed from the upper surface in the Z1 direction is similar to that of FIG. 4 according to the first embodiment.

The planar structure of the semiconductor layer 104 when viewed from the upper surface in the Z2 direction will be described with reference to FIG. 21. FIG. 21 is a plan view showing an example of the planar structure in the array area of the array chip 100 when viewed from the upper surface in the Z2 direction. FIG. 21 shows a part of the array area of the block BLK0. FIG. 21 omits an interlayer insulating layer. The following description will be given focusing on a layout of the members DST.

With respect to FIG. 5 according to the first embodiment, FIG. 21 differs in that in the cell area a plurality of members DST (hereinafter, also referred to as "members DST2") are further arranged between the plurality of members DST1 arranged in positions respectively facing the members SLT. The plurality of members DST2 are arranged side by side in the Y direction. That is, the members DST1 and DST2 are arranged side by side in the Y direction. Each member SHE is arranged below each member DST2 and overlaps the member DST2 in the Z direction. In other words, the member DST2 is arranged in a position facing the member SHE with the semiconductor layer 103 and the plurality of interconnect layers 101 intervening therebetween in the Z direction. The member DST2 extends in the X direction and crosses the cell area. One end of the member DST2 is included in the hookup area. The member DST2 is formed into a linear shape. No memory pillar MP is arranged below the member DST2 in the Z direction. The length of the member DST2 in the X direction may be substantially equal to that of the member SHE or may be greater or smaller than that of the member SHE. It suffices that the member DST2 extends from at least one end portion in the X direction of the cell area to the other end portion. The member DST1 and the member DST2 may be substantially equal or different in length.

2.2 Cross-Sectional Structure of Array Chip

An example of the cross-sectional structure in the array area of the array chip 100 will be described.

The cross-sectional structure taken along line I-I of FIG. 21 is similar to that of FIG. 6 according to the first embodiment.

Figure 22:
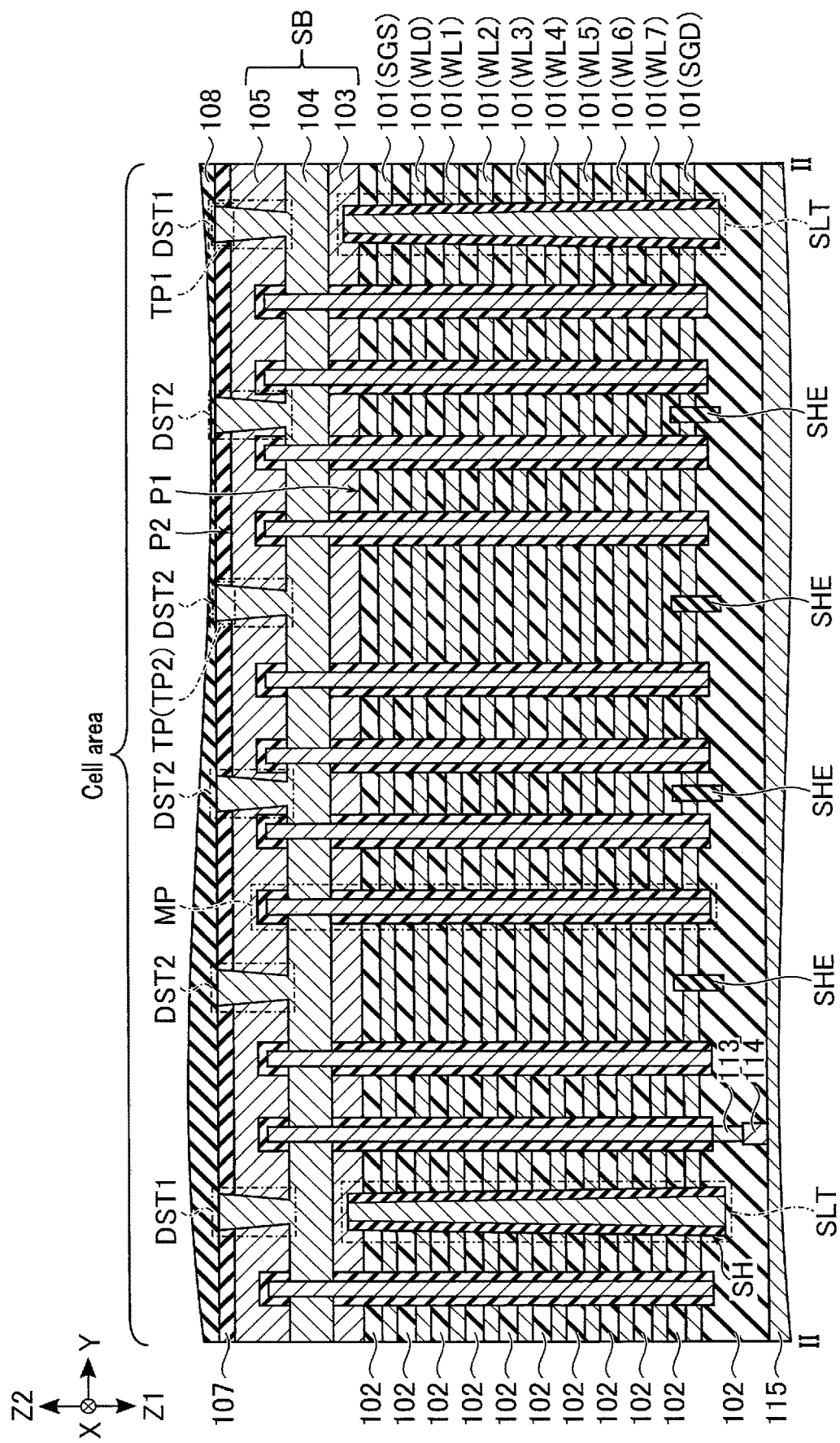
FIG. 22 is a cross-sectional view taken along line II-II of FIG. 21 and shows an example of a cross-sectional structure in the array area of the semiconductor memory device according to the second embodiment.

FIG. 22 is a cross-sectional view taken along line II-II of FIG. 21 and shows an example of the cross-sectional structure in the array area of the array chip 100. FIG. 22 shows a part of the cell area. FIG. 22 omits the interconnect layer 109, the insulating layer 110, the passivation layer 111, the plurality of contact plugs 116, the interconnect layer 117, the plurality of contact plugs 118, the insulating layer 119, and the plurality of electrode pads 120.

The member DST2 penetrates through the semiconductor layer 105 and the insulating layer 107 in the Z2 direction, and the end in the Z2 direction of the member DST2 is in contact with the insulating layer 108. The member DST2 is provided in a position in which it overlaps the member SHE in the Z direction. In other words, the layer stack SB containing the semiconductor layers 103 to 105 functioning as a source line SL has a projecting portion TP (hereinafter, also referred to as a "projecting portion TP2") on the side of the second surface P2 facing the first surface P1. The projecting portion TP2 projects in the Z direction in a position in which it overlaps the member SHE in the Z direction. In the layer stack SB containing the semiconductor layers 103 to 105, a portion positioned between the first surface P1 and the second surface P2, and the projecting portion TP2 are integrally formed. The projecting portion TP2 is formed into a linear shape extending in the X direction. The projecting portion TP2 is configured in such a manner that its longitudinal direction is set to the X direction. The projecting portion TP2 faces (overlaps) the member SHE in the Z direction and does not face the memory pillar MP.

2.3 Advantageous Effects of Present Embodiment

The second embodiment produces advantageous effects similar to those of the first embodiment.

As a matter of course, the present embodiment is applicable to the first modification and the second modification of the first embodiment.

3. Third Embodiment

A semiconductor memory device according to a third embodiment will be described. The semiconductor memory device 3 according to the present embodiment differs from the first embodiment in terms of a layout of the member DST in the cell area of the array chip 100. Hereinafter, the following description will in principle concentrate on the features different from the first embodiment.

3.1 Planar Structure of Array Chip

An example of a planar structure in the array area of the array chip 100 will be described.

Figure 23:
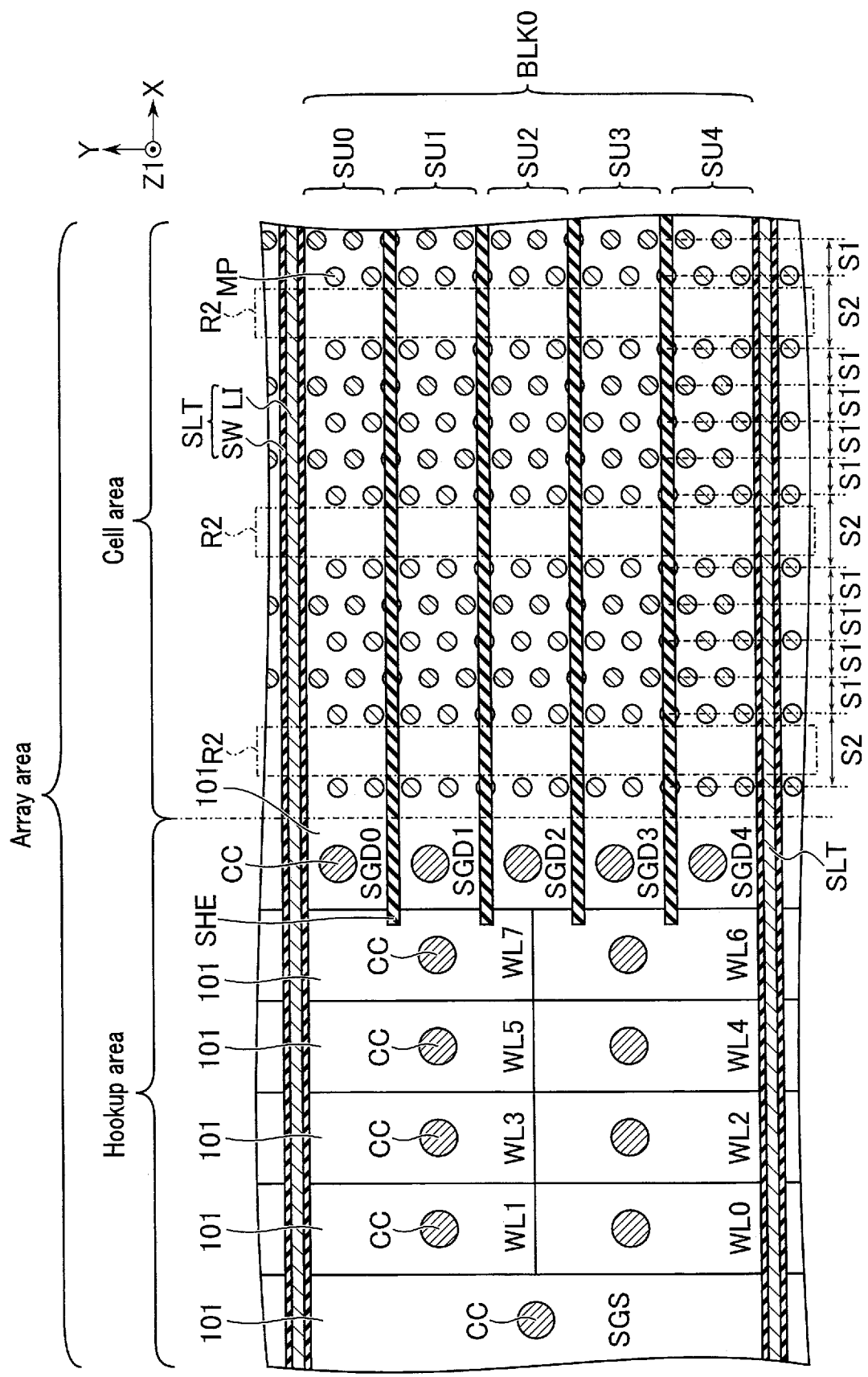
FIG. 23 is a plan view showing an example of a planar structure when viewed from an upper surface in the Z1 direction in an array area of a semiconductor memory device according to a third embodiment.

First, the planar structure when viewed from the upper surface in the Z1 direction will be described with reference to FIG. 23. FIG. 23 is a plan view showing an example of the planar structure in the array area of the array chip 100 when viewed from the upper surface in the Z1 direction. FIG. 23 shows a part of the array area of the block BLK0. FIG. 23 omits an interlayer insulating layer.

In the cell area, the plurality of memory pillars MP are arranged, for example, in a staggered pattern. As shown in FIG. 23, an interval between the memory pillars MP arranged in the X direction is, for example, an interval S1 or an interval S2. The interval S2 is greater than the interval S1. In other words, no memory pillar MP is arranged between the memory pillars MP spaced apart from each other at the interval S2 in the X direction. That is, no memory pillar MP is arranged in areas R2 in FIG. 23.

Figure 24:
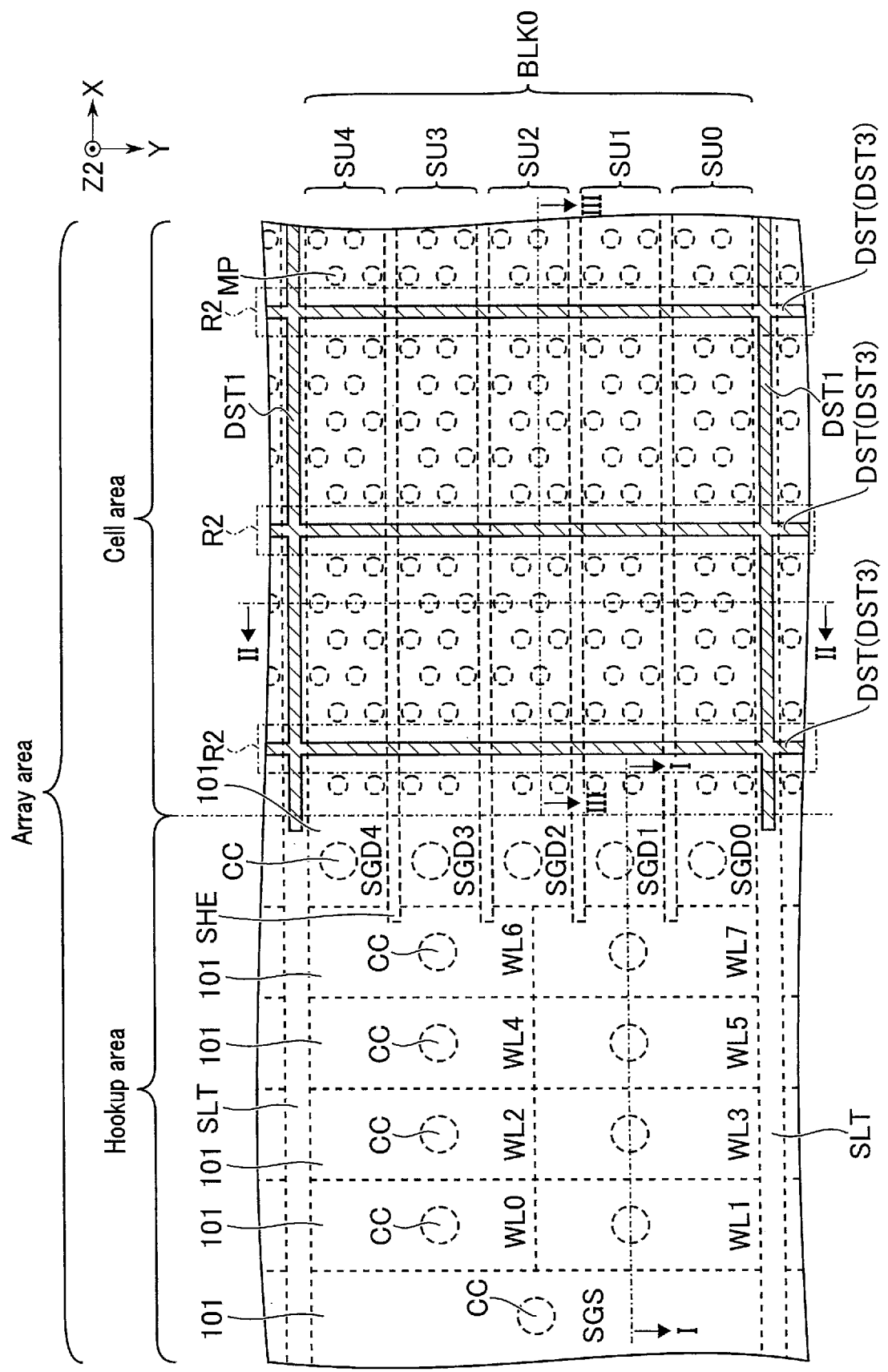
FIG. 24 is a plan view showing an example of a planar structure when viewed from an upper surface in the Z2 direction in the array area of the semiconductor memory device according to the third embodiment.

Next, the planar structure of the semiconductor layer 104 when viewed from the upper surface in the Z2 direction will be described with reference to FIG. 24. FIG. 24 is a plan view showing an example of the planar structure in the array area of the array chip 100 when viewed from the upper surface in the Z2 direction. FIG. 24 shows a part of the array area of the block BLK0. FIG. 24 omits an interlayer insulating layer. The following description will be given focusing on a layout of the members DST.

With respect to FIG. 5 according to the first embodiment, FIG. 24 differs in that in the cell area a plurality of members DST (hereinafter, also referred to as "members DST3") are further arranged in the areas R2 in which no memory pillar MP is arranged. The members DST3 are arranged side by side in the X direction. Each of the members DST3 extends in the Y direction and intersects the member DST1 arranged in a position facing the member SLT. Except for an area intersecting the member DST1, the plurality of interconnect layers 101 are provided below the member DST3 and partially overlap the member DST3 in the Z direction. The member DST3 is formed into a linear shape. No memory pillar MP is arranged below the member DST3 in the Z direction.

3.2 Cross-Sectional Structure of Array Chip

An example of the cross-sectional structure in the array area of the array chip 100 will be described.

The cross-sectional structure taken along line I-I of FIG. 24 is similar to that of FIG. 6 according to the first embodiment. The cross-sectional structure taken along line II-II of FIG. 24 is similar to that of FIG. 8 according to the first embodiment.

Figure 25:
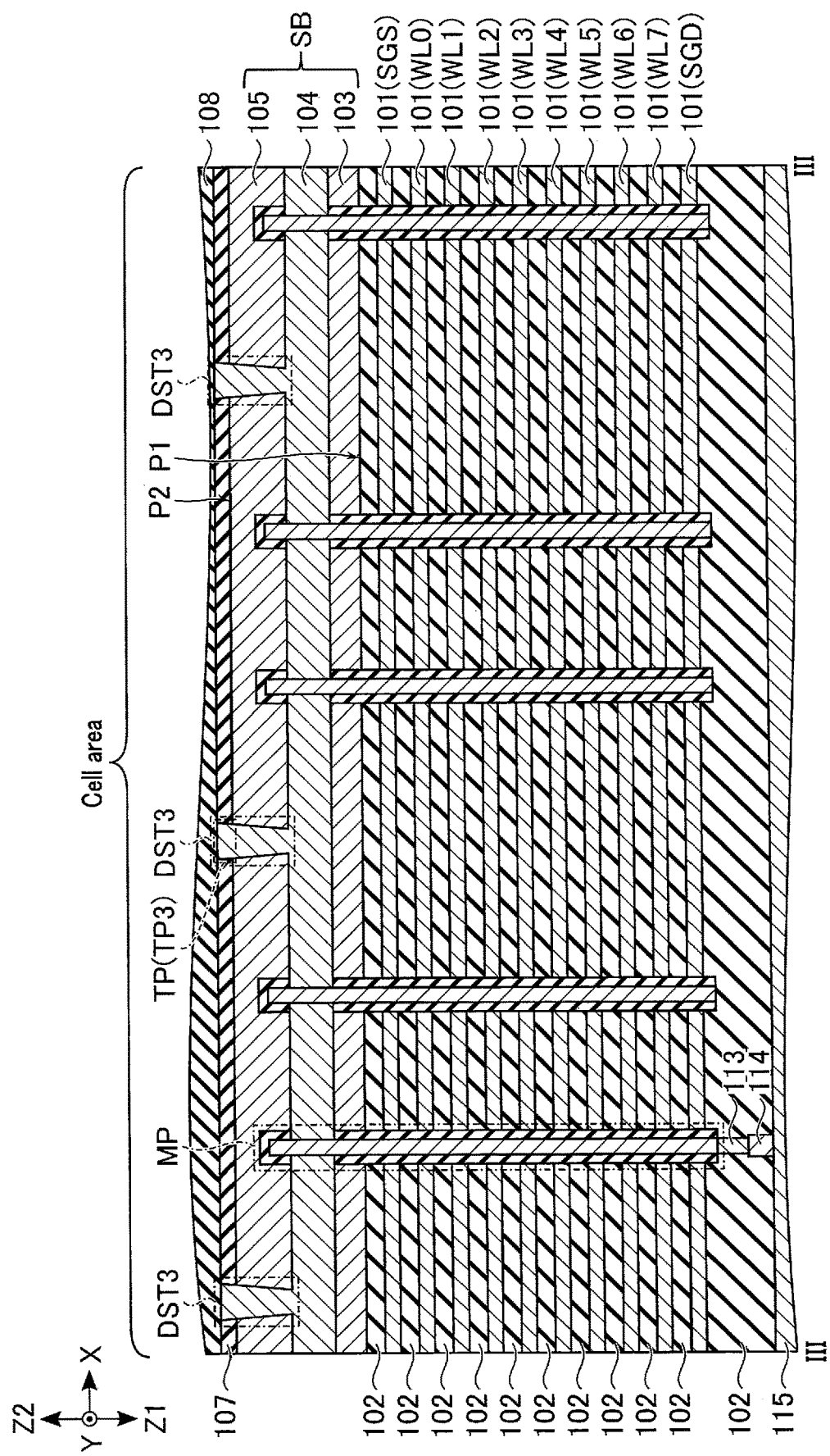
FIG. 25 is a cross-sectional view taken along line of FIG. 24 and shows an example of a cross-sectional structure in the array area of the semiconductor memory device according to the third embodiment.

FIG. 25 is a cross-sectional view taken along line of FIG. 24 and shows an example of the cross-sectional structure in the array area of the array chip 100. FIG. 25 shows a part of the cell area. FIG. 25 omits the interconnect layer 109, the insulating layer 110, the passivation layer 111, the plurality of contact plugs 116, the interconnect layer 117, the plurality of contact plugs 118, the insulating layer 119, and the plurality of electrode pads 120.

The member DST3 penetrates through the semiconductor layer 105 and the insulating layer 107 in the Z2 direction, and the end in the Z2 direction of the DST3 is in contact with the insulating layer 108. The member DST3 is provided in a position in which no memory pillar MP is arranged in the Z direction. In other words, the layer stack SB containing the semiconductor layers 103 to 105 and functioning as a source line SL has a projecting portion TP (hereinafter, also referred to as a "projecting portion TP3") on the side of the second surface P2 facing the first surface P1. The projecting portion TP3 projects in the Z direction and partially overlaps, in the Z direction, each of the interconnect layers 101 arranged side by side in the Y direction. In the layer stack SB containing the semiconductor layers 103 to 105, a portion positioned between the first surface P1 and the second surface P2, and the projecting portion TP3 are integrally formed. The projecting portion TP3 is formed into a linear shape extending in the Y direction. The projecting portion TP3 is configured in such a manner that its longitudinal direction is set to the Y direction. The projecting portion TP3 overlaps each of the interconnect layers 101 arranged side by side in the Y direction with the member SLT intervening therebetween within the area R2 in the Z direction, and does not face the memory pillars MP arranged outside the area R2.

3.3 Advantageous Effects of Present Embodiment

The third embodiment produces the advantageous effects similar to those of the first embodiment.

As a matter of course, the present embodiment is applicable to the first modification and the second modification of the first embodiment.

4. Fourth Embodiment

A semiconductor memory device according to a fourth embodiment will be described. The semiconductor memory device 3 according to the present embodiment differs from the second embodiment in terms of a layout of the members DST in the cell area of the array chip 100. Hereinafter, the following description will in principle concentrate on the features different from the second embodiment.

4.1 Planar Structure of Array Chip

An example of a planar structure in the array area of the array chip 100 will be described.

The planar structure when viewed from the upper surface in the Z1 direction is similar to that of FIG. 23 according to the third embodiment.

Figure 26:
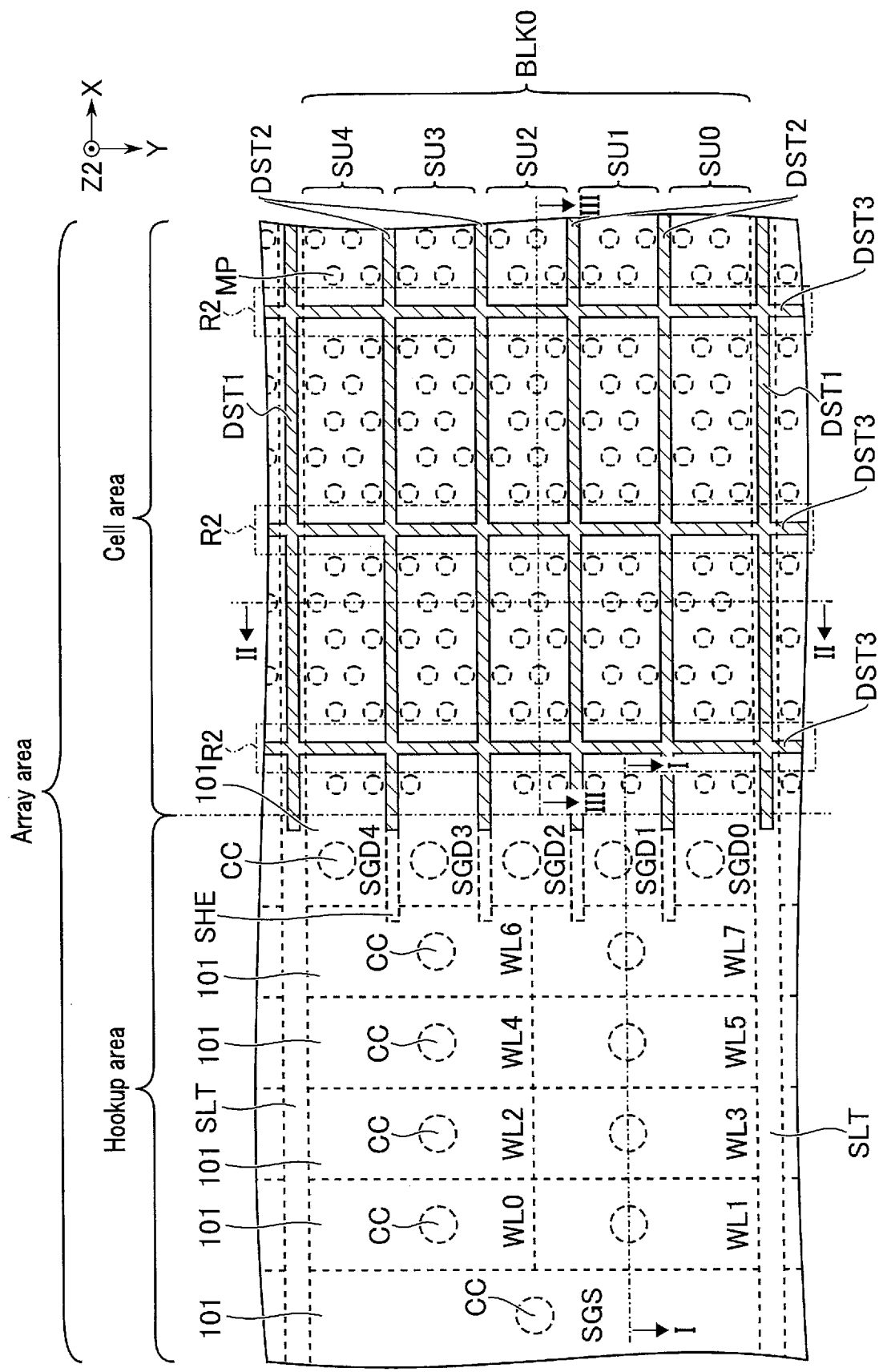
FIG. 26 is a plan view showing an example of a planar structure when viewed from an upper surface in the Z2 direction in an array area of a semiconductor memory device according to a fourth embodiment.

The planar structure of the semiconductor layer 104 when viewed from the upper surface in the Z2 direction will be described with reference to FIG. 26. FIG. 26 is a plan view showing an example of the planar structure in the array area of the array chip 100 when viewed from the upper surface in the Z2 direction. FIG. 26 shows a part of the array area of the block BLK0. FIG. 26 omits an interlayer insulating layer. The following description will be given focusing on a layout of the members DST.

With respect to FIG. 21 according to the second embodiment, FIG. 26 differs in that in the cell area a plurality of members DST3 are further arranged in the areas R2 in which no memory pillar MP is arranged. The members DST3 are arranged side by side in the X direction. Each of the members DST3 extends in the Y direction and intersects the member DST1 arranged in a position facing the member SLT, and intersects the member DST2 arranged in a position facing the member SHE. In other words, the layer stack SB containing the semiconductor layers 103 to 105 has, on the side of its second surface P2, the member DST2 (projecting portion TP2) and the member DST3 (projecting portion TP3) that are provided in such a manner as to intersect each other. Except for an area intersecting the member DST1, the plurality of interconnect layers 101 are provided below the member DST3 and partially overlap the member DST3 in the Z direction. The member DST3 is formed into a linear shape. No memory pillar MP is arranged below the member DST3 in the Z direction.

4.2 Cross-Sectional Structure of Array Chip

An example of the cross-sectional structure in the array area of the array chip 100 will be described.

The cross-sectional structure taken along line I-I of FIG. 26 is similar to that of FIG. 6 according to the first embodiment. The cross-sectional structure taken along line II-II of FIG. 26 is similar to that of FIG. 22 according to the second embodiment. The cross-sectional structure taken along line III-III of FIG. 26 is similar to that of FIG. 25 according to the third embodiment. In the layer stack SB containing the semiconductor layers 103 to 105, a portion positioned between the first surface. P1 and the second surface P2, the projecting portion TP1, the projecting portion TP2, and the projecting portion TP3 are integrally formed.

4.3 Advantageous Effects of Present Embodiment

The fourth embodiment produces the advantageous effects similar to those of the first embodiment.

As a matter of course, the present embodiment is applicable to the first modification and the second modification of the first embodiment.

5. Modification, Etc.

As described in the above, a semiconductor memory device according to the embodiments includes: a semiconductor layer (SB) arranged above a substrate (201) in a first direction (Z2); a first interconnect layer (101) arranged between the substrate (201) and the semiconductor layer (SB); a second interconnect layer (101) arranged between the substrate (201) and the semiconductor layer (SB) and arranged adjacent to the first interconnect layer (101) in a second direction (Y) intersecting the first direction (Z2); a plurality of memory pillars (MP) extending in the first direction (Z2) and penetrating through the first interconnect layer (101), an end portion in the first direction (Z2) of each of the memory pillars (MP) being in contact with the semiconductor layer (SB); and a first member (SLT) provided between the first interconnect layer (101) and the second interconnect layer (101) in the second direction (Y), an end portion in the first direction (Z2) of the first member (SLT) being in contact with the semiconductor layer (SB). The semiconductor layer (SB) has, on a side of a second surface (P2) facing a first surface (P1) in contact with the first member (SLT), a first projecting portion (TP1 to 3) projecting in the first direction (Z2) and overlapping a part of an area in the first direction (Z2), the area being provided with the first interconnect layer (101) and the first member (SLT).

The embodiments are not limited to those described in the above, and various modifications can be made.

Furthermore, the order of the steps in the flowchart described in the above embodiments may be altered to the extent possible.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

The invention claimed is:

1. A semiconductor memory device comprising:
   a source layer arranged above a substrate in a first direction;
   a first interconnect layer arranged between the substrate and the source layer;
   a second interconnect layer arranged between the substrate and the source layer and arranged adjacent to the first interconnect layer in a second direction intersecting the first direction;
   a plurality of memory pillars penetrating through the first interconnect layer in the first direction, and each having a semiconductor film which extends in the first direction and is electrically coupled to the source layer at an end portion in the first direction; and
   a first member provided between the first interconnect layer and the second interconnect layer in the second direction, an end portion in the first direction of the first member being in contact with the source layer,
   wherein the source layer has a first semiconductor layer which is in contact with the semiconductor film of each of the memory pillars and a second semiconductor layer which is arranged between the substrate and the first semiconductor layer,
   in the first semiconductor layer, a surface on an opposite side to the substrate in the first direction has at least one first projecting portion projecting in the first direction and overlapping a part of an area in the first direction, the area being provided with the first interconnect layer and the first member, and
   in the second semiconductor layer, a surface on an opposite side to the substrate in the first direction is in contact with the first semiconductor layer without having a projecting portion projecting in the first direction.

2. The device according to claim 1, wherein the first projecting portion is configured in such a manner that a longitudinal direction of the first projecting portion is set to a third direction intersecting the first direction and the second direction.

3. The device according to claim 1, wherein the first semiconductor layer has a portion which extends in the second direction and in a third direction intersecting the first direction and the second direction over the area provided with the first interconnect layer and the first member, the portion being in contact with the semiconductor film of each of the memory pillars, and the portion which extends in the second direction and in the third direction and the first projecting portion are integrally formed.

4. The device according to claim 3, wherein the portion which extends in the second direction and in the third direction and the first projecting portion include silicon doped with phosphorus.

5. The device according to claim 1, further comprising a third interconnect layer provided above source layer in the first direction,
   wherein the source layer is electrically coupled to the third interconnect layer via the first projecting portion.

6. The device according to claim 1, wherein the first projecting portion faces the first member in the first direction.

7. The device according to claim 6,
   wherein the surface on the opposite side of the first semiconductor layer further includes at least one second projecting portion projecting in the first direction and overlapping a part of an area which is provided with the first interconnect layer in the first direction.

8. The device according to claim 7, wherein the at least one second projecting portion comprises a plurality of second projecting portions, and the second projecting portions are larger in number than the at least one first projecting portion.

9. The device according to claim 7, wherein the first interconnect layer functions as a word line and memory cell transistors are respectively formed in portions in which the plurality of memory pillars intersect the first interconnect layer.

10. The device according to claim 7, wherein the first semiconductor layer has a portion which extends in the second direction and in a third direction intersecting the first direction and the second direction over the area provided with the first interconnect layer and the first member, the portion being in contact with the semiconductor film of each of the memory pillars, and the portion which extends in the second direction and in the third direction and the second projecting portion are integrally formed.

11. The device according to claim 10, wherein the first projecting portion, the portion which extends in the second direction and in the third direction, and the second projecting portion are further integrally formed.

12. The device according to claim 11, wherein the first projecting portion, the portion which extends in the second direction and in the third direction, and the second projecting portion include silicon doped with phosphorus.

13. The device according to claim 10, wherein the portion which extends in the second direction and in the third direction and the second projecting portion include silicon doped with phosphorus.

14. The device according to claim 6, wherein the first projecting portion and the first member are configured in such a manner that a longitudinal direction of each of the first projecting portion and the first member is set to a third direction intersecting the first direction and the second direction.

15. The device according to claim 1, wherein the first semiconductor layer and the second semiconductor layer include silicon.

16. The device according to claim 1, wherein a thickness of the first semiconductor layer is larger than that of the second semiconductor layer in the first direction.

17. A semiconductor memory device comprising:
a layer stack above a substrate in a first direction, the layer stack containing a first semiconductor layer, a second semiconductor layer, and a third semiconductor layer arranged in this order from a side of the substrate;
an insulating layer provided between the first semiconductor layer and the third semiconductor layer and provided in a same layer as the second semiconductor layer;
a first interconnect layer arranged between the substrate and the layer stack;
a second interconnect layer arranged between the substrate and the layer stack and arranged adjacent to the first interconnect layer in a second direction intersecting the first direction;
a plurality of memory pillars extending in the first direction, and penetrating the first interconnect layer, the first semiconductor layer, and the second semiconductor layer, an end portion in the first direction of each of the memory pillars being in contact with the third semiconductor layer; and
a first member provided between the first interconnect layer and the second interconnect layer in the second direction and extending in the first direction,
wherein an end in the first direction of the first member is in contact with the first semiconductor layer and is not in contact with the second semiconductor layer and the third semiconductor layer.

18. The device according to claim 17, wherein the first member includes an insulating material.

19. The device according to claim 18, wherein the first member further includes a conductive material.

20. The device according to claim 17, wherein the first member faces the second semiconductor layer and the third semiconductor layer in the first direction.

* * * * *